United States Patent [19]

Kirlin et al.

[11] Patent Number: 5,225,561
[45] Date of Patent: Jul. 6, 1993

[54] SOURCE REAGENT COMPOUNDS FOR MOCVD OF REFRACTORY FILMS CONTAINING GROUP IIA ELEMENTS

[75] Inventors: Peter S. Kirlin, Brookfield; Duncan W. Brown, Wilton; Robin A. Gardiner, Bethel, all of Conn.

[73] Assignee: Advanced Technology Materials, Inc., Danbury, Conn.

[21] Appl. No.: 581,631

[22] Filed: Sep. 12, 1990

Related U.S. Application Data

[63] Continuation-in-part of Ser. No. 549,389, Jul. 6, 1990, abandoned.

[51] Int. Cl.$^5$ .................... C07C 41/00; C07C 211/00; C07D 213/22; C07D 307/02
[52] U.S. Cl. .................................. 546/256; 546/257; 546/259; 546/266; 549/497; 549/505; 564/463; 564/510; 564/511; 564/512; 568/412; 568/615; 568/677
[58] Field of Search ...................... 568/677, 615, 412; 546/256, 257, 259, 266; 549/497, 505; 564/510, 511, 512, 463

[56] References Cited

U.S. PATENT DOCUMENTS

| | | | |
|---|---|---|---|
| 3,549,412 | 12/1970 | Frey, Jr. et al. | |
| 3,894,164 | 7/1975 | Dismukes et al. | 427/70 |
| 3,978,272 | 8/1976 | Donley | 428/434 |
| 4,148,940 | 4/1979 | Breininger et al. | 427/226 |
| 4,501,602 | 2/1985 | Miller et al. | 65/18.2 |
| 4,732,110 | 3/1988 | Parsons | 118/719 |
| 4,735,852 | 4/1988 | Osada | 428/336 |
| 4,804,649 | 2/1989 | Sherif | 505/1 |
| 4,808,651 | 2/1989 | Blickle et al. | 568/677 |
| 4,837,609 | 6/1989 | Gurvitch et al. | 505/1 |
| 4,845,308 | 7/1989 | Womack, Jr. | 174/15.4 |
| 4,869,598 | 9/1989 | McDonald | 374/176 |
| 4,870,052 | 9/1989 | Engler et al. | 505/1 |
| 4,880,770 | 11/1989 | Mir et al. | 505/1 |
| 4,882,312 | 11/1989 | Mogro-Campero | 505/1 |
| 4,908,346 | 3/1990 | Strom et al. | 505/1 |
| 4,908,348 | 3/1990 | Hung et al. | 505/1 |
| 4,915,988 | 4/1990 | Erbil | 427/252 |
| 4,916,115 | 4/1990 | Mantese et al. | 505/1 |
| 4,918,051 | 4/1990 | Mantese et al. | 505/1 |
| 4,931,425 | 6/1990 | Kimura et al. | 505/1 |
| 4,933,317 | 6/1990 | Johnston, Jr. et al. | 505/1 |
| 4,935,385 | 6/1990 | Biegelsen | 437/111 |
| 4,935,626 | 6/1990 | Schneider | 250/336.2 |
| 4,937,225 | 6/1990 | Kalonji et al. | 357/71 |
| 4,940,693 | 7/1990 | Shappirio et al. | 505/1 |
| 4,943,558 | 7/1990 | Soltis et al. | 505/1 |
| 4,943,559 | 7/1990 | Severin et al. | 505/1 |

FOREIGN PATENT DOCUMENTS

| | | |
|---|---|---|
| 0328333 | 8/1989 | European Pat. Off. |
| 0331483A2 | 9/1989 | European Pat. Off. |
| 0342009A2 | 11/1989 | European Pat. Off. |
| 90201485.1 | 6/1990 | European Pat. Off. |
| WO8905696 | 6/1989 | PCT Int'l Appl. |
| WO8907666 | 8/1989 | PCT Int'l Appl. |

OTHER PUBLICATIONS

"Epitaxial Film Growths of Artificial (Bi-O)/(-Sr-Ca-Cu-O) Layered Structures" Fujita, J., et al, Appl. Phys. Lett., vol. 54, No. 23, Jun., 1989, pp. 2364–2366.

(List continued on next page.)

Primary Examiner—C. Warren Ivy
Assistant Examiner—Raymond Covington
Attorney, Agent, or Firm—Steven J. Hultquist

[57] ABSTRACT

Metal organic chemical vapor deposition (MOCVD) formation of copper oxide superconductor materials. Various source reagents of Group II elements suitable for high temperature superconductor (HTSC) material formation are described, including beta-diketonates, cyclopentadienyls, alkyls, perfluoroalkyls, alkoxides, perfluoroalkoxides, and Schiff bases, as well as complexes of such Group II compounds, utilizing monodentate or multidentate ligands to provide additional coordination to the Group IIA atom, so that the resulting complex is of enhanced volatility characteristics, and enhanced suitability for MOCVD applications. Also disclosed are methods of synthesizing such compounds and complexes, including a method of making Group II metal beta-diketonate compounds having enhanced thermal stability characteristics. Further disclosed are a vertical inverted reactor for chemical vapor deposition, and various methods of processing applied metal oxide films for enhanced HTSC character.

35 Claims, 6 Drawing Sheets

OTHER PUBLICATIONS

"High $T_c$ Oxide Superconductors," Maple, M. B., Ed., MRS Bulletin, Jan. 1989, pp. 20-21.

"Effect of Noble Metal Buffer Layers on Superconducting $YBa_2Cu_3O_7$ Thin Films," Appl. Phys. Lett., 1987, vol. 51, pp. 2155-2157.

"Suitability of Metal Beta-Diketonates as MOCVD--Precursors for High $T_c$ Superconductors" C.I.M.A. Spee, et al, TNO Instiute of Applied Chemistry 1988.

"Thin Films of Barium Fluoride Scintillator Deposited by Chemical Vapor Deposition," P. S. Kirlin, et al pp. 261-264, 1989.

"Growth of High $T_c$ YBaCuO Thin Films by Metalorganic Chemical Vapor Deposition" P. S. Kirlin, et al, SPIE vol. 1187 pp. 115 to 127, 1988.

"Superconductors Beyond 123" Cava, R. J., Sci. Amer. Aug., 1990 pp. 42-49.

"Reduced Pressure MOCVD of C-Axis Oriented BiSrCaCuO Thin Films" Hamaguchi, N. Japanese Journal of Applied Physics, vol. 29, No. 4, Apr. 1990 L596-L599.

"A Study of Bis(Hexafluoroacetylacetonato) Copper (II)," Betrand, J. A., et al Inorganic Chemistry, vol. 5, No. 3, Mar., 1966, pp. 489-491.

"Volatile Alkaline Earth Chelates of Fluorinated Alkanoylpivalylmethanes," Belcher, R., et al Analytica Chem. Acta, 60 (1972) pp. 109-116.

"High $T_c$ Oxide Superconductors" Maple, M. B., Ed, MRS Bulletin/Jan. 1989, pp. 20-21.

"Microstructure and Properties of Superconducting Sputter Deposited Y-Ba-Cu-O Films" Kwasnick, R. F., et al, J. Mater. Res. vol. 4, No. 2, 1989, pp. 257-266.

"Fluorination of the High-$T_c$ Superconductors $YBa_2Cu_3O_{7-\Delta}$," Sauer, N. N., et al 1988, pp. 813-818.

"Solution Synthesis of Calcium, Strontium and Barium Metallocenes" McCormick, M. J., et al Polyhedran, vol. 7, No. 9, 1988, pp. 725-730.

"A Review of Metal Organic Chemical Vapor Deposition of High-Temperature Superconducting Thin--Films" Erbil, A., et al, SPIE vol. 1187 1989, 104-109.

"In-Situ Formation of Superconducting $YBa_2Cu_3O_{7-x}$ Thin Films Using Pure Ozone Vapor Oxidation," Berkeley, D. D., et al, Appl. Phys. Lett. vol. 53, No. 20 Nov. 1988, pp. 1973 to 1975.

"In-Situ Processing of Epitaxial Y-Ba-Cu-O High $T_c$ Superconducting Films on (100) $SrTiO_3$ and (100) $YS-ZrO_2$ Substrates at 500-650° C." Singh, R. K., et al. Appl Phys. Lett. vol. 54, No. 22, May 1989, pp. 2271-2273.

"As-Grown Superconducting Bi-Sr-Ca-Cu-O Thin Films by Coevaporation" Yoshitake, T., et al Appl. Phys. Lett. vol. 55, No. 7, Aug. 1989, pp. 702-704.

"Inorganic Scintillating Films and Optical Fibers Using CVD Films," Winn, D. R. et al (unpublished).

"High $T_c$ Bismuth and Thallium Copper Oxide Superconductors" Sleight, A. W., et al MRS Bulletin/Jan. 1989, pp. 45-48.

"Effect of the Post-Deposition Processing Ambient on the Preparation of Superconducting $YBa_2Cu_3O_{7-x}$ Coevaporated Thin Films Using a $BaF_2$ Source" Chan, S-W, et al, Appl. Phys. Lett., vol. 53, No. 15, Oct. 1988, pp. 1443-1445.

"A Few Coments on Superconducting AC Electric Machines," Keim, T. A., GE Research Center, pp. 147-149, 1984.

"MOCVD in Inverted Stagnation Point Flow", Journal of Crystal Growth, 77, 1986 pp. 120-127 (North-Holland).

"CVD in Stagnation Point Flow" Houtman, C., et al Journal of the Electro Chemn. Soc. May, 1986, pp. 961-970.

SOURCE REAGENT COMPOUNDS FOR MOCVD OF REFRACTORY FILMS CONTAINING GROUP IIA ELEMENTS

CROSS-REFERENCE TO RELATED APPLICATION

This is a continuation-in-part of U.S. application No. 07/549,389 filed Jul. 6, 1990, now abandoned in the names of Peter S. Kirlin, et al. for "Apparatus and Method for Delivery of Involatile Reagents."

BACKGROUND OF THE INVENTION

1. Field of the Invention

This invention relates to processes for forming a thin film on a substrate by decomposition of a thermally decomposable organometallic compound, and to thermally decomposable organometallic compounds and complexes which are useful in such processes. In another aspect, the present invention relates to a method of forming on a substrate a copper-containing superconducting oxide wherein at least one of the elemental constituents of the oxide is deposited by chemical vapor deposition from a metal organic source reagent. In a still further aspect, the present invention relates to a chemical vapor deposition reactor which may be usefully employed to form layers such as high temperature superconductor films on substrates.

2. Description of the Related Art

The recent discovery of the oxide-type high temperature superconductors (HTSC) has been followed by a tremendous effort to fabricate these materials in technologically useful forms. In particular, several thin film deposition methods have succeeded in producing films with short range epitaxy and critical current densities exceeding $10^6$ Amps/cm$^2$. For the commercial potential of high temperature superconductivity to be realized, future process development must focus on cost-effective scale-up. Metal-organic chemical vapor deposition (MOCVD) is a particularly attractive method for forming these films because it is readily scaled up to production runs and because the electronics industry has a wide experience and equipment base in the use of CVD technology which can be applied to new MOCVD processes. Unfortunately, MOCVD processes require starting reagents ("source reagents") with sufficiently high volatility and chemical stability to permit gas-phase transport into the reactor chamber without premature decomposition. This requirement is difficult to meet for the Group IIA metals; in general, well-suited CVD source reagents for barium, calcium, strontium, and magnesium are not known.

The HTSC materials contemplated for fabrication by MOCVD include various types of materials, such as metal oxide superconductors comprising admixtures of metals from Groups IB, IIA, and IIIB of the Periodic Table. Illustrative materials of such type include the metal oxide superconductors of the yttrium-barium-copper type ($YBa_2Cu_3O_y$) type, the so-called "123" HTSC materials, wherein y may be from about 6 to about 7.3, as well as materials where Y may be substituted by Nd, Sm, Eu, Gd, Dy, Ho, Yb, Lu, $Y_{0.5}$-$Sc_{0.5}$, $Y_{0.5}$-$La_{0.5}$, and $Y_{0.5}$-$Lu_{0.5}$, and where Ba may be substituted by Sr-Ca, Ba-Sr, and Ba-Ca. Another illustrative class of superconductor materials includes those of the general formula $(AO)_mM_2Ca_{n-1}Cu_nO_{2n+2}$, wherein the A cation can be thallium, lead, bismuth, or a mixture of these elements, m=1 or 2 (but is only 2 when A is bismuth), n is a number of from 1 to 5, the M cation is barium or strontium, and the substitution of calcium by strontium frequently is observed, as described in "High $T_c$ Oxide Superconductors," MRS Bulletin, January, 1989, pages 20-24, and "High $T_c$ Bismuth and Thallium Oxide Superconductors," Sleight, A. W., et al, MRS Bulletin, January, 1989, pages 45-48. Uses currently envisioned for these copper oxide superconductors include high speed opening switches, bolometers, and high frequency communications components such as mixers.

MOCVD of other compounds that contain barium, calcium, and/or strontium is subject to the same source reagent difficulty. Examples of other Group IIA-containing compounds that might desirably be employed in thin film form by MOCVD include $BaTiO_3$, $SrTiO_3$, $BaF_2$, $CaF_2$, and $SrF_2$.

Barium titanate, $BaTiO_3$, has been identified as a ferroelectric material with unique and potentially very useful properties. $BaTiO_3$ in film or epitaxial layer form is useful in photonic applications such as optical switching, holographic memory storage, and sensors. In these applications, a $BaTiO_3$ film is the active element. Applications in which the refractory materials may need to be deposited in film or layer form include integrated circuits, switches, radiation detectors, thin film capacitors, holographic storage media, and various other microelectronic devices.

The Group II metal fluorides, $BaF_2$, $CaF_2$, and $SrF_2$, are materials that are useful for scintillation detecting and coating of optical fibers. Thin films of the Group II metal fluorides, $BaF_2$, $CaF_2$, and $SrF_2$, are potentially very useful as buffer layers for interfacing between silicon substrates and HTSC or GaAs overlayers. For example, a silicon substrate could be coated with an epitaxial layer of $BaF_2/CaF_2$ whose composition is tailored for a close lattice match to the silicon. If the Ba/Ca ratio could be controlled precisely in the growing $BaF_2/CaF_2$ layer, the lattice constant could be graded to approach the lattice constant of GaAs. Thus, a gallium arsenide epitaxial layer could be grown over the $BaF_2/CaF_2$ interlayer, allowing the production of integrated GaAs devices on widely available, high quality silicon substrates. Another potential use of $BaF_2/CaF_2$ interlayers would be as buffers between silicon substrates and polycrystalline HTSC films for applications such as nonequilibrium infrared detectors. Such an interlayer would permit the HTSC to be used in monolithic integrated circuits on silicon substrates.

Chemical vapor deposition (CVD) and metal-organic chemical vapor deposition (MOCVD) have been extensively described in the literature as techniques for depositing thin films of elements and compounds. A heat-decomposable compound (an organometallic in the case of MOCVD, referred to as the "source reagent") is contacted with a substrate which has been heated to a temperature above the decomposition temperature of the source reagent. The source reagent decomposes to deposit the element or metal on the substrate. By using more than one source reagent and adjusting the deposition parameters, deposition of compounds is possible. Control of key variables such as stoichiometry and film thickness and coating of a wide variety of substrate geometries are generally possible with MOCVD. Forming the thin films by MOCVD will permit the integration of these materials into existing device production technologies. MOCVD also permits the formation of layers of the refractory materials that are epitaxially related to substrates having similar crystal structures.

MOCVD requires that the element source reagents be sufficiently volatile to permit gas phase transport into the deposition reactor. The element source reagent must decompose in the reactor to deposit only the desired element at the desired growth temperatures. Premature gas phase reactions leading to particulate formation must not occur, nor should the source reagent decompose in the lines before reaching the reactor deposition chamber. When compounds, especially HTSC materials, are desired to be deposited, obtaining optimal properties requires close control of stoichiometry which can be achieved only if the reagent can be delivered into the reactor in a controllable fashion. Close control of stoichiometry would also be desired, for example, in the application described above involving graded $BaF_2/CaF_2$ interlayers.

In many cases, the source reagents are solids which can be sublimed for gas-phase transport into the reactor. However, the sublimation temperature may be very close to the decomposition temperature, in which case the reagent may begin to decompose in the lines before reaching the reactor, so that it will be very difficult t control the stoichiometry of the deposited films.

Organogroup II complexes are particularly problematic. Numerous Group II-containing acetylacetonates are volatile, including even some calcium and strontium derivatives. In fact, the barium complexes of 2,2,6,6-tetramethyl-3,5-heptanedione (Hthd) and 1,1,1,2,2,3,3-heptafluoro-7,7-dimethyl-4,6-octanedione (Hfod) have been shown to have limited volatility at elevated temperatures. Unfortunately, the compounds were reported to decompose at the temperatures required for sublimation ($>190°$ C.) and were reported to be associated in the gas phase. Unpredictable gas phase association can lead to difficulties in controlling and reliably reproducing the desired gas phase transport of the source reagent into the reactor.

With the use of conventional bubblers in CVD operations, the bubbler is held at a temperature sufficiently high to sublime the reagent, and consequently significant and somewhat variable decomposition of the source reagents can occur during a single growth run. This premature decomposition causes variations in the composition as a function of thickness of the as-deposited film and poor reproducibility in film stoichiometry between different growth runs.

Inexacting compositional control is particularly deleterious to high temperature superconducting thin films because the superconducting properties are extremely sensitive to the stoichiometry of the layer. Two approaches involving the use of nonconventional hardware have been tried to overcome this problem.

The first method eliminates the bubblers and uses a reactor tube which contains concentric tubes, each containing a boat filled with a single source reagent. A temperature gradient is applied along the tube to vaporize each material at the required temperature. There are several drawbacks to this method: (1) as with standard bubblers, significant decomposition occurs during a given run because the reagents are held at high temperatures for the duration of the run, (2) temperature control is not as good as with standard bubblers, thus giving rise to wide variations in source reagent vapor pressure and consequently to wide variations in the stoichiometry of the as-deposited films, and (3) the boats need to be charged before each run, a step which is not consistent with a high volume commercial process.

The second method uses two bubblers in series. The first bubbler contains a volatile chelating ligand which presumably acts to stabilize and/or to lower the melting point of the source reagent which is contained in the second (downstream) bubbler. Stabilities on the order of a few hours have been realized with this method, which are sufficient for a single run. However, a fresh charge of source reagent is needed before each run. In addition, some enhancement of the vapor pressure of the source reagent occurs. Unfortunately, the amount of enhancement is not reproducible, which again causes variations in the stoichiometry of the as-deposited films.

In summary, the techniques heretofore employed for formation of Group IIA-containing thin films from relatively involatile reagents have not permitted efficient delivery of the reagents into the reactor or tight control of reagent ratios, with consequent adverse effect on achievement and reproduceability of the desired film stoichiometry.

It is an object of the present invention to provide an efficient method for forming high temperature superconducting material layers on substrates, and apparatus useful therefor.

It is an object of the present invention to provide novel source reagents useful for chemical vapor deposition of barium, calcium, strontium, and magnesium, and compounds containing one or more of these elements.

It is a further object of the present invention to provide a method for using the novel source reagents in MOCVD processes for HTSCs and other materials that incorporate barium, calcium, strontium, and/or magnesium.

It is another object of the invention to provide a method of making various Group II metal precursor compounds based on beta-diketonates, which achieve significantly increased thermal stability of the product, as compared with corresponding compounds produced by prior art synthesis methods.

It is a still further object in the present invention to provide a chemical vapor deposition reactor having particular utility for formation of high temperature superconducting films having highly controllable stoichiometry.

Other objects and advantages of the present invention will be more fully apparent from the ensuing disclosure and appended claims.

SUMMARY OF THE INVENTION

In one aspect, the present invention relates to a Group II metalorganic complex of the formula:

$$MA_2X$$

wherein:
- M is selected from the group consisting of barium, calcium, magnesium, and strontium;
- A is a monodentate or multidentate organic ligand coordinated to M which allows complexing of $MA_2$ with ligand X and which forms sub-complex $MA_2$ with M which is stable at standard temperature and pressure (STP) conditions, hereafter referred to as "a stable STP sub-complex $MA_2$";
- each of the A ligands may be the same or different; and
- X is a monodentate or multidentate ligand coordinated to M and containing one or more atoms independently selected from the group consisting of atoms of the elements C, N, H, S, O, and F.

The monodentate or multidentate organic ligand A in the above-described complex may for example be a moiety selected from beta-diketonates, cyclopentadienyls, alkyls, perfluoroalkyls, alkoxides, perfluoroalkoxides, and Schiff bases.

In the above-described Group II metalorganic complex, the ligands A and ligand X may each be separate and distinct individual groups, however it is also within the broad purview of the present invention for a single group to contain more than one of these ligands. For example, both of the ligands A may be present in a single group. As another example, the ligand X and at least one of the ligands A may be present in a single group.

Another aspect of the invention relates to a method of making a Group II $\beta$-diketonate compound, comprising reacting a hydride of the Group II metal with a dione corresponding to the $\beta$-diketonate, in a non-aqueous solvent medium.

The multidentate ligand X in the above-described complex may suitably comprise oxyhydrocarbyl ligands, nitrogenous oxyhydrocarbyl ligands, or fluorooxyhydrocarbyl ligands. For example, X may be selected from the group consisting of:

(a) amines and polyamines;
(b) bipyridines;
(c) ligands of the formula:

wherein G is —O—, —S—, or —NR— wherein R is H or hydrocarbyl;
(d) crown ethers or cryptates; and
(e) ligands of the formula:

$$R^0O(C(R^1)_2C(R^2)_2O)_nR^0$$

wherein:
$R^0$ = H, methyl, ethyl, n-propyl, cyanato, perfluoroethyl, perfluoro-n-propyl, or vinyl;
$R^1$ = H, F, or a sterically acceptable hydrocarbyl substituent;
$R^2$ = H, F, or a sterically acceptable hydrocarbyl substituent;
n = 4, 5, or 6; and
each $R^0$, $R^1$, and $R^2$ may be the same as or different from the other $R^0$, $R^1$, and $R^2$ respectively.

A further aspect of the invention relates to a method of forming on a substrate a layer of a material selected from the group consisting of (i) HTSC materials, (ii) barium titanate, (iii) barium fluoride, (iv) strontium fluoride, and (v) calcium fluoride, including the step of depositing at least one of the elemental constituents of said material on the substrate by chemical vapor deposition from organosource reagent(s) therefor.

In another aspect, the present invention relates to a method of forming a copper oxide HTSC material layer on a substrate comprising in addition to copper and oxygen at least two elemental constituents selected from the group consisting of Ba, Ca, Sr, La, Nd, Ce, Pr, Y, Sm, Eu, Th, Gd, Tb Dy, Ho, Er, Tm Yb, Lu, Bi, Tl, and Pb, including the step of depositing at least one of the constituents selected from the group consisting of Cu, Ba, Ca, Sr, La, Nd, Ce, Pr, Sm, Eu, Th, Gd, Tb, Dy, Ho, Er, Tm, Yb, Lu, Bi, Tl, Y, and Pb, by chemical vapor deposition from organosource reagent(s) therefor.

In another aspect, the present invention relates to a method of forming on a substrate a copper-containing superconducting oxide comprising a Group II metal constituent selected from barium, calcium, and strontium, comprising depositing said Group II metal constituent on said substrate via chemical vapor deposition from a Group II metalorganic complex of the formula:

wherein:
M is barium, calcium, or strontium;
A is a monodentate or multidentate organic ligand coordinated to M which allows complexing of $MA_2$ with ligand X and which forms a stable STP sub-complex $MA_2$ with M;
each of the A-ligands may be the same or different; and
X is a monodentate or multidentate ligand coordinated to M and containing one or more atoms independently selected from the group consisting of atoms of the elements C, N, H, S, O, and F.

The multidentate organic ligand A may be of any suitable species, and for example may advantageously be selected from the group consisting of beta-diketonates, cyclopentadienyls, alkyls, perfluoroalkyls, alkoxides, perfluoroalkoxides, and Schiff bases. Ligands such as beta-diketonates and cyclopentadienyls are particularly advantageously employed to effect superior deposition of Group IIA elements from source reagents comprising same.

In a still further aspect, the present invention relates to a chemical vapor deposition reactor of inverted vertical configuration comprising a pedestal with means for securing a substrate element thereto such that a surface of the substrate element is exposed in a downwardly facing position. The reactor chamber is constructed so as to induce a vertical upward laminar flow of source reagent introduced into the reactor and to direct the source reagent flow to the surface of the substrate element on the pedestal. The walls of the reactor are tapered with a specific angular relationship, hereinafter more fully described, to effect high utilization of the source reagent in the CVD operation carried out in the reactor. The reactor optionally features a removable injector module which is selectively positionable in concentric relationship to the pedestal and at a selected axial distance therefrom, so that maximum utilization of the source reagent is achieved.

Other aspects and features will be more fully apparent from the ensuing disclosure and appended claims.

DETAILED DESCRIPTION OF THE DRAWINGS

DETAILED DESCRIPTION OF THE INVENTION AND PREFERRED EMBODIMENTS THEREOF

Figure 1:
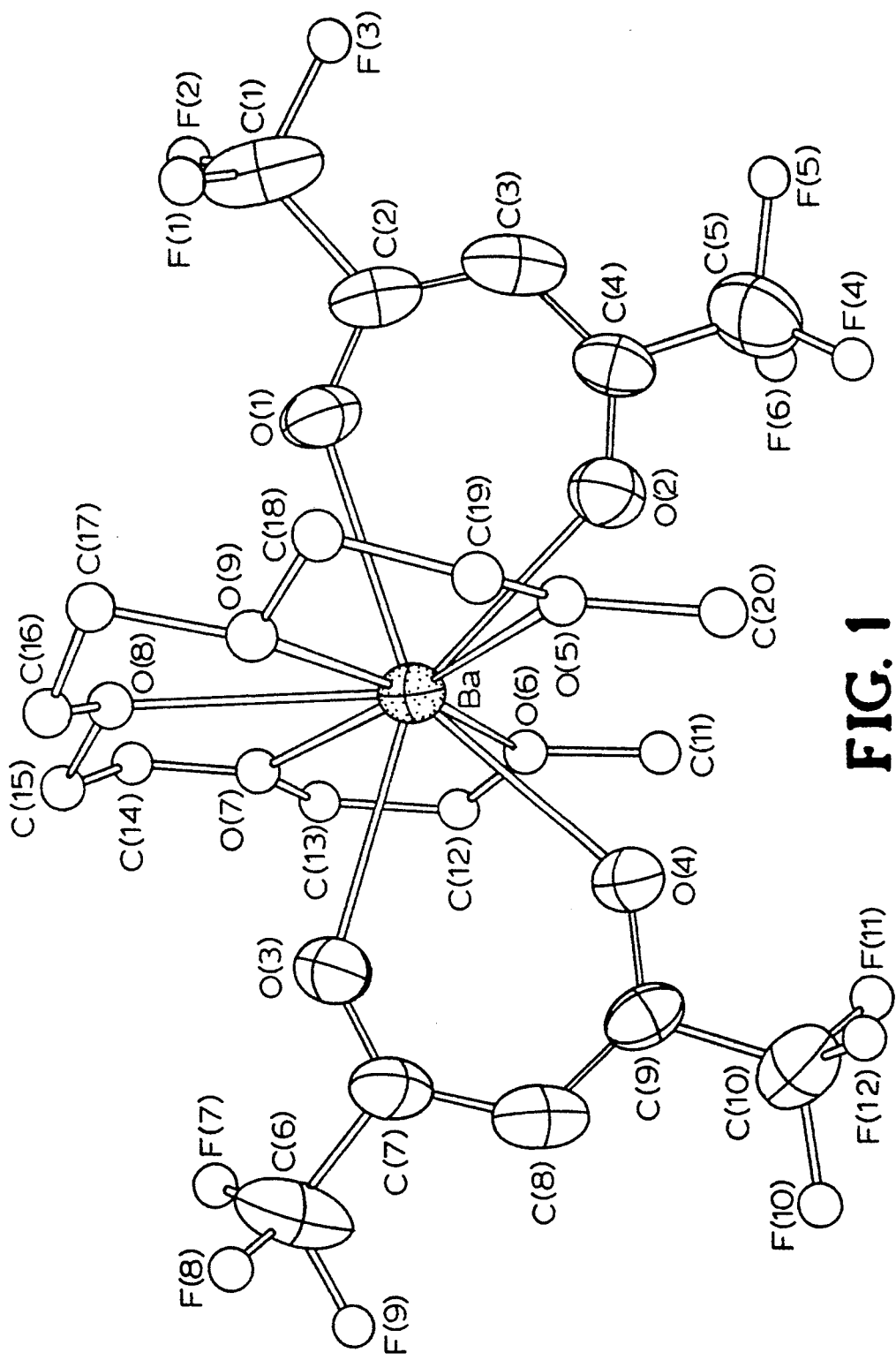
FIG. 1 is an ORTEP diagram showing the three-dimensional structure of barium bis (1,1,1,5,5,5-hexafluoro-2,4-pentanedionate) tetraglyme complex.

The present invention broadly contemplates the formation of copper oxide high temperature superconducting (HTSC) materials on substrates by chemical vapor deposition (CVD) of at least one of the elemental constituents of the HTSC material.

Presently known copper oxide HTSC materials comprise, in addition to copper and oxygen, elements such as those of the following group: Ba, Ca, Sr, Tl, Bi, Pb, Y, Nd, Ce, Sm, Eu, Gd, Tb, Dy, La, Ho, Er, Tm, Yb, and Lu. These elements may be employed in combination with copper and oxygen to yield a wide variety of copper oxide superconductors, such as, but not limited to, those identified in Table I below.

posited on the substrate by chemical vapor deposition from organosource reagents therefor.

Thus, as mentioned, the organocopper source reagent may comprise a fluorinated beta-diketonate compound of copper. In like manner, the organometal source reagents for the other HTSC metal constituents may include fluorinated beta-diketonate compounds of the appertaining elements.

As a further specific example, a 123 HTSC material may be formed with yttrium being deposited by CVD from a yttrium source reagent such as yttrium tris (2,2,6,6-tetramethyl-3,5-heptanedionate) complex. Barium may be incorporated in the film by CVD application from a barium source reagent such as barium hexafluoroacetylacetonate, or other barium source compounds or complexes, as described more fully hereinafter.

The source reagents used in the broad practice of the present invention to deposit constituent element(s) thereof preferably meet the following criteria: (1) they have vapor pressures of at least 100 microns of mercury at a temperature of 120°–250° C., (2) they are thermally stable below temperatures of about 120°–250° C. and therefore do not decompose in the bubblers, (3) they cleanly decompose to deposit the desired element(s) with little or no carbon incorporation, and (4) they thermally decompose with the deposition of the element at a temperature of $\geq 400°$ C.

TABLE I

| Copper Oxide Superconductors | | |
|---|---|---|
| Formula | Possible Substitutions | Transition Temperature, °K. |
| $Nd_{2-x}Ce_xCuO_{4-y}F_y$ | Pr, Sm, Eu; Th | 10–25 |
| $La_{1.8-x}Sm_xSr_{.2}CuO_4$ | Eu, Gd, Tb, Dy | 20 |
| $Bi_2Sr_2Sm_{2-2x}Ce_{2x}Cu_2O_{10}$ | Eu or Gd | 20–25 |
| $Ba_{1.33}Nd_{.67}Sm_{1.33}Ce_{.67}Cu_3O_9$ | Sm, Eu, Gd, Nd, Eu, Gd | 40 |
| $La_{2-x}Ba_xCuO_4$ | Ca, Sr | 20–40 |
| $La_{2-x}Sr_xCaCuO_6$ | — | 60 |
| $Pb_2Sr_{2+x}Pr_{1-x}Cu_3O_8$ | Nd, Sm, Eu, Gd, Tb, Dy, Ho, Er, Tm | 70–85 |
| $YBa_2Cu_3O_7$ | La, Nd, Sm, Eu, Gd, Dy, Ho, Er, Tm, Yb, Lu, $Cu_4O_8$, $Cu_7O_{15}$ | 80–93 |
| $Bi_2Sr_2CuO_6$ | $CaCu_2O_8$, $Ca_2Cu_3O_{10}$ | 0–110 |
| $TlBa_2Cu_2O_5$ | $CaCu_2O_7$, $Ca_2Cu_3O_9$, $Ca_3Cu_4O_{11}$ | 0–122 |
| $Tl_2Ba_2CuO_6$ | $CaCu_2O_3$, $Ca_2Cu_3O_{10}$ | 80–125 |

In accordance with the invention, the copper oxide HTSC material is formed on the substrate by depositing at least one of the constituents (i.e., copper and other identified elemental constituents) by chemical vapor deposition from organosource reagent(s) therefor. Thus, the copper oxide HTSC material may be formed on the substrate by CVD application of copper on the substrate from an organocopper source reagent, such as copper bis (hexafluroacetylacetonate) or copper bis (acetylacetonate). The resulting copper layer may be formed in an oxic (oxygen-containing) atmosphere to provide a copper oxide material. In order to constitute an HTSC material, the copper and oxygen must be in combination with at least two other elemental constituents (as described above), which may likewise be de- High vapor pressures of the source reagents are required to enable a sufficient amount of the reagent vapor to be transported, e.g., directly flowed, or carried in an inert gas or other carrier gas stream, into the reactor at temperatures convenient for MOCVD processing (i.e., $T<200°$ C.).

In accordance with a preferred aspect of the present invention, the volatility of Group IIA metalorganic compounds such as Group IIA alkyls, alkoxides, and B-diketonate complexes is substantially enhanced by complexing, e.g., chelating, the parent compound with bi- or polydentate ligands. Examples of ligands that can be used to enhance the volatility of the source reagents include polyamines, polyethers, glymes, alcohols, and saturated heterocyclic compounds such as tetrahydrofuran.

Broadly, the Group II metalorganic complexes of the invention, such as may be employed to provide an enhanced volatility metalorganic source reagent for CVD application of the constituent Group IIA element, include those of the formula:

$$MA_2X$$

wherein:
M is barium, calcium, or strontium;
A is a monodentate or multidentate organic ligand coordinated to M which allows complexing of $MA_2$ with ligand X and which forms a stable STP sub-complex $MA_2$ with M;
each of the A ligands may be the same or different; and
X is a monodentate or multidentate ligand coordinated to M and containing one or more atoms independently selected from the group consisting of atoms of the elements C, N, H, S, O, and F.

The monodentate or multidentate organic ligand A may be of any suitable species, and for example may advantageously be selected from the group consisting of beta-diketonates, cyclopentadienyls, alkyls, perfluoroalkyls, alkoxides, perfluoroalkoxides, and Schiff bases. Ligands such as beta-diketonates and cyclopentadienyls have advantageously been employed to effect superior deposition of Group IIA elements from source reagents comprising same.

Illustrative of particular species which may be employed as the monodentate or multidentate organic ligand A are the following:
(i) 2,2,6,6-tetramethyl-3,5-heptanedionate;
(ii) 1,1,1,5,5,5-hexafluoro-2,4-pentanedionate;
(iii) 1,1,1,2,2,3,3-heptafluoro-7,7-dimethyl-4,6-octanedionate;
(iv) cyclopentadienyl;
(v) 4,4'-(ethane-1,2-diyldiimino) bis (3-pentene-2-one);
(vi) pentamethylcyclopentadienyl and other substituted cyclopentadienyls;
(vii) 2,4-pentadionate; and
(viii) 1,1,1-trifluoro-2,4-pentadionate.

The monodentate or multidentate ligand X likewise may be any suitable species which is functionally effective to coordinate to the Group IIA metal. Preferred monodentate or multidentate ligand species include:
(i) oxyhydrocarbyl ligands;
(ii) nitrogenous oxyhydrocarbyl ligands; and
(iii) fluorooxyhydrocarbyl ligands.

For example, X may be potentially be advantageously selected from among the following species:
(a) amines and polyamines;
(b) bipyridines;
(c) ligands of the formula:

wherein G is —O—, —S—, or —NR— wherein R is H or hydrocarbyl;
(d) crown ethers; and
(e) ligands of the formula:

$$R^0O(C(R^1)_2C(R^2)_2O)_nR^0$$

wherein:
$R^0$ = H, methyl, ethyl, n-propyl, cyanato, perfluoroethyl, perfluoro-n-propyl, or vinyl;
$R^1$ = H, F, or a sterically acceptable hydrocarbyl substituent;
$R^2$ = H, F, or a sterically acceptable hydrocarbyl substituent;
n = 4, 5, or 6; and
each $R^0$, $R^1$, and $R^2$ may be the same as or different from the other $R^0$, $R^1$, and $R^2$, respectively.

By way of specific example, X may advantageously be a ligand species such as tetraglyme, tetrahydrofuran, bipyridine, or a crown ether such as 18-crown-6.

In one advantageous embodiment, the Group IIA organometal complex may comprise a ligand X of the formula $$R^0O(C(R^1)_2C(R^2)_2O)_4R^0$$

wherein:
each $R^0$, $R^1$ and $R^2$ is selected independently, and
$R^0$ = H, $CH_3$, or $C_2H_5$; and
$R^1$, and $R^2$ = H or F.

A particularly preferred class of barium metalorganic complexes include those wherein the monodentate or multidentate organic ligand A is a beta-diketonate or bipyridene, and X is tetraglyme.

The above-described Group II metalorganic complexes of the invention may be usefully employed to deposit the appertaining Group II metal constituent on a substrate via chemical vapor deposition of the complex. Thus, complexes of such type may be used to deposit barium, calcium, and strontium, in the formation of a superconducting copper oxide material on a substrate.

With reference to the $MA_2$ moiety of the $MA_2X$ Group II metalorganic complex of the present invention, A is a monodentate or multidentate organic ligand coordinated to M which allows complexing of $MA_2$ with ligand X and which forms a stable STP sub-complex $MA_2$ with M. As used herein, the term "stable STP sub-complex $M_2$" means that the compound, or sub-complex, $MA_2$ is thermodynamically stable at standard temperature and pressure (STP) conditions, viz., a pressure of one atmosphere and a temperature of 25° C.

In general, the $MA_2$ compounds may be synthesized by known synthesis methods. The resulting $MA_2$ sub-complex then is complexed with the monodentate or multidentate ligand X by reaction therewith. For example, when X is a liquid, the sub-complex $MA_2$ may be dissolved therein, and excess, non-coordinated X component may be removed from the metalorganic complex $MA_2X$ by conventional separation methods such as extraction or distillation. In any event, the ligand species X may be reacted with the sub-complex $MA_2$ to form the Group II metalorganic complex $MA_2X$, or alternatively, the M, A, and X components or their precursors may be otherwise reacted to form such complexes.

Specific reaction conditions and procedures for such reactions will be readily determinable by those skilled in the art without undue experimentation, particularly in light of the illustrative examples set forth hereinafter.

As mentioned hereinabove, a preferred Group II metalorganic complex according to the present invention is based on beta-diketonate ligand species. Although Group II metal beta-diketonate compounds are known per se (although not the further complexed materials of the present invention having the formula MA₂X, as described hereinabove), previously known Group II metal beta-diketonate compounds are highly thermally unstable in character, and such thermal instability is substantially worsened by the presence of water. Given the highly electropositive nature of barium, association of barium compounds with trace amounts of water is almost inevitable in the previously known synthesis methods, since these methods employ water as a solvent.

Such thermal instability and water association problems are overcome in a specific aspect of the present invention relating to the making of Group II metal beta-diketonate compounds. In the improved methodology, a hydride of the Group II metal is reacted with a dione corresponding to the beta-diketonate, and such reaction is carried out in a non-aqueous solvent medium. The non-aqueous solvent medium may for example comprise a straight chain ether such as diethyl ether, or a solvent of the formula:

wherein G is selected from the group consisting of —S—, —O—, and —NR— wherein R is H or hydrocarbyl.

Preferably, such solvent is tetrahydrofuran (i.e., G=—O—), but other saturated heterocyclic compounds, such as pyrrolidine (G=—NH—) or tetrahydrothiophene (G=—S—) may potentially usefully be employed, as well as saturated derivatives of compounds of the above general formula.

In the above-described synthesis method for making Group II metal beta-diketonate compounds, the dione may suitably have the formula:

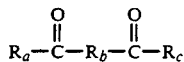

wherein $R_a$ is fluoroalkyl, $R_b$ is alkylene, and $R_c$ is alkyl.

Preferably, in the dione of the above formula $R_a$ is perfluoropropyl, $R_b$ is methylene, and $R_c$ is t-butyl.

The Group II metalorganic complexes of the present invention take advantage of the fact that although Group IIA metals are usually found in the +2 oxidation state and formally have two ligands, their coordination numbers can be substantially greater, e.g., in the case of barium, such coordination number can range to 8 or more. The complexes of the present invention utilize the association tendencies of the Group IIA metals to employ plural monodentate and/or multidentate ligands binding to a single Group IIA metal atom and occupying significant coordination sites to disrupt association, thereby significantly increasing the volatility of the resulting complexes.

In the Group II metalorganic complexes described above, the ligands A and ligand X may each be structurally distinct constituents of the complex, relative to one another, or alternatively, two or even all three of such ligands may be covalently bonded to each other or otherwise structurally joined, independent of their separate coordination attachments to the central or nuclear atom M. Thus, for example, a single molecule may contain two ligand A moieties each of which comprises one or more coordinating atoms attached to M. Alternatively, A and X ligand moieties may be present in the same group or molecule, each contributing one or more coordinating atoms attached to M in the complex.

FIG. 1 shows an ORTEP diagram depicting the three-dimensional configuration of barium bis (1,1,1,5,5,5-hexafluoro-2,4-pentanedionate), sometimes referred to hereinafter by the shorthand designation Ba(hfacac)₂, as complexed with tetraglyme, $CH_3O(CH_2CH_2O)_4CH_3$. For ease of reference, tetraglyme is sometimes hereinafter referred to by the shorthand designation "tg".

In the ORTEP diagram of FIG. 1, the elipsoidal shapes for various carbon and oxygen atoms indicate 95% probability of position (within 2 standard deviations). In this depiction of the molecule, hydrogen atoms have been omitted for clarity, and will be understood to be present to render the carbon atoms in the complex tetravalent in character.

Figure 2:
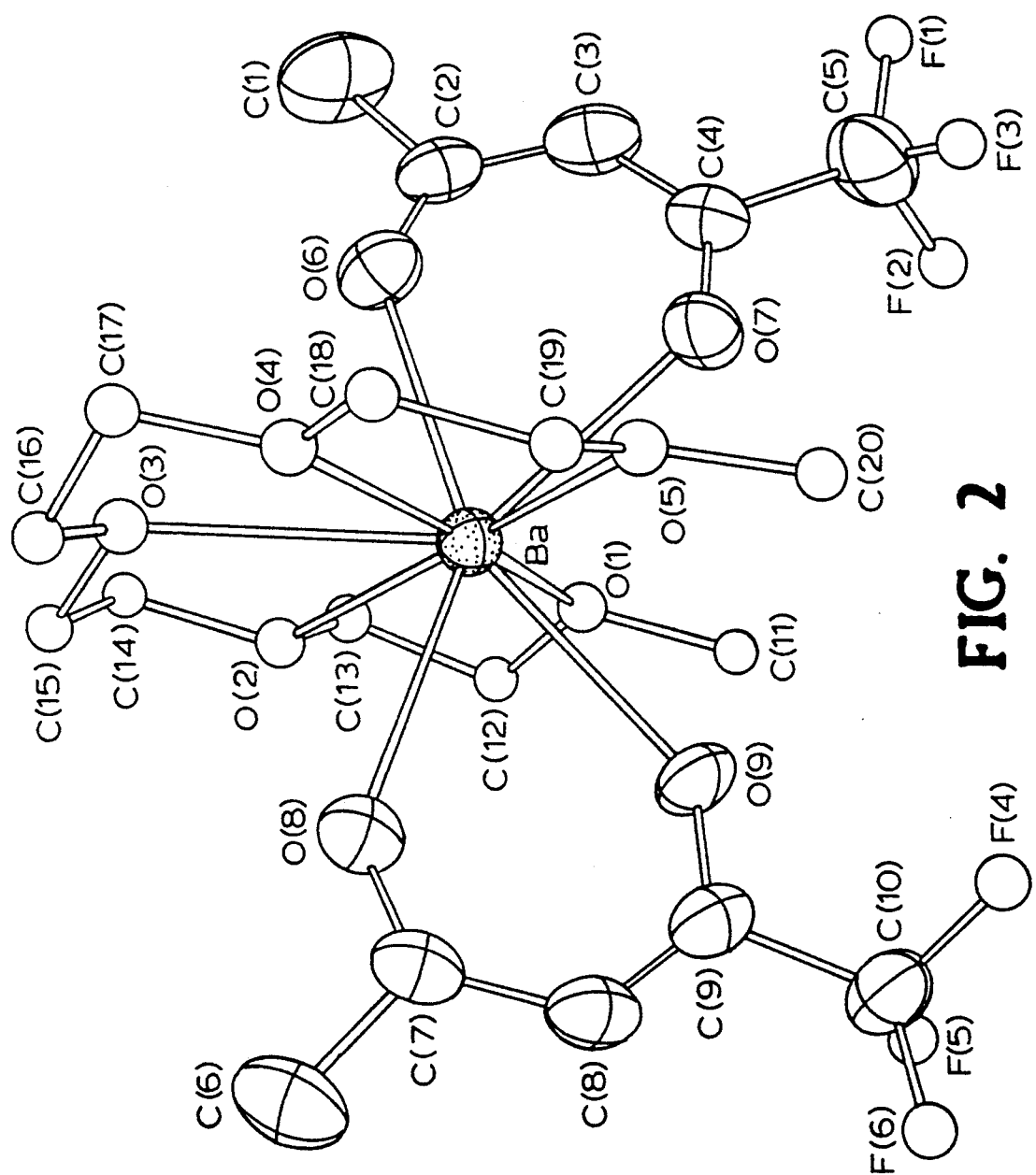
FIG. 2 is an ORTEP diagram showing the three-dimensional structure of barium bis (5,5,5-trifluoro-2,4-pentanedionate) tetraglyme complex.

FIG. 2 is an ORTEP diagram of another barium organometal complex according to the present invention, viz., barium bis (1,1,1-trifluoro-2,4-pentanedionate) tetraglyme adduct. The fluorinated dionate ligand in this complex is sometimes hereinafter designated "tfacac" for ease of reference.

Figure 3:
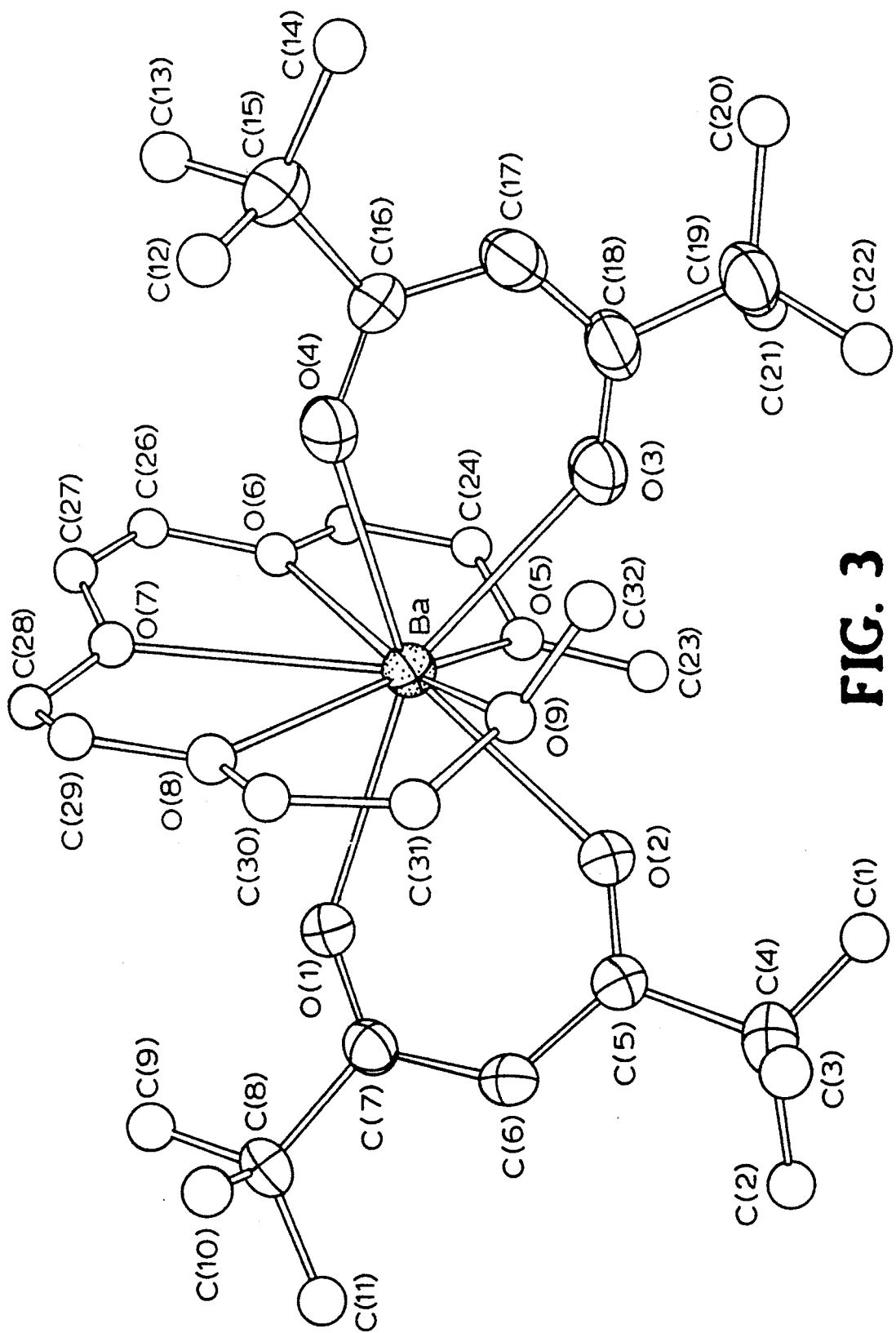
FIG. 3 is an ORTEP diagram showing the three-dimensional structure of a barium bis (2,2,6,6-tetramethyl-3,5-heptanedionate) tetraglyme complex.

FIG. 3 is an ORTEP diagram of yet another barium diketonate tetraglyme complex according to the present invention, barium bis (2,2,6,6-tetramethyl-3,5-heptanedionate) tetraglyme adduct. The dionate ligand in this complex is sometimes hereinafter designated thd" for ease of reference.

Set out in Table II below are crystallographic data for the barium diketonate adducts of FIGS. 1-3, respectively. Section (a) of this Table sets forth the crystal parameters, Section (b) summarizes the data collection techniques and parameters, and Section (c) shows data for the refinement of the determined information.

TABLE II

| | FIG. 1 | FIG. 2 | FIG. 3 |
|---|---|---|---|
| (a) Crystal Parameters | | | |
| formula | $C_{20}H_{24}F_{12}O_9Ba$ | $C_{20}H_{20}F_6O_9Ba$ | $C_{32}H_{60}O_9Ba$ |
| space group | P1̄ | P1̄ | P1̄ |
| crystal system | triclinic | triclinic | triclinic |
| a, Å | 9.6477 (21) | 9.5655 (26) | 10.6063 (26) |
| b, Å | 11.1547 (22) | 10.4002 (29) | 14.452 (3) |
| c, Å | 15.4645 (31) | 15.230 (4) | 15.463 (4) |
| α, deg | 94.151 (16) | 93.010 (22) | 115.311 (18) |
| β, deg | 90.730 (17) | 91.702 (22) | 97.739 (20) |
| γ, deg | 114.458 (15) | 109.631 (21) | 105.155 (18) |
| V, Å³ | 1509.2 (5) | 1423.3 (6) | 1984.0 (8) |
| Z | 2 | 2 | 2 |
| Cryst. dimen., mm | 0.38 × 0.40 × 0.42 | 0.38 × 0.38 × 0.40 | 0.45 × 0.22 × 0.36 |
| cryst color | colorless | colorless | colorless |
| D (calc), g/cm³ | 1.702 | 1.553 | 1.215 |

TABLE II-continued

|  | FIG 1 | FIG. 2 | FIG. 3 |
|---|---|---|---|
| $\mu(MoK\alpha)$, cm$^{-1}$ | 14.61 | 15.07 | 10.61 |
| temp. °C. | 23 (1) | 23 (1) | 23 (1) |
| T (max)/T (min) | 1.085 | 1.099 | 1.013 |
| (b) Data Collection | | | |
| diffractometer | Nicolet R3m | | |
| monochromator | graphite | | |
| scan technique | Wycoff | | |
| radiation | MoK$\alpha$($\lambda$ = 0.71073 Å) | | |
| 2$\Theta$ scan range, deg | 4–50 | 4–57 | 4–48 |
| data collected (h, k, l) | ±12, ±14, +19 | ±13, ±14, +21 | ±13, ±17, +18 |
| scan speed, deg/min | var. 5–20 | var. 5–20 | var. 10–30 |
| rflns. collected | 5539 | 7476 | 6477 |
| indpt. rflns. | 5320 | 7216 | 6217 |
| R (merg), % | 1.95 | 2.49 | 2.64 |
| indpt. rflns. obsvd Fo > 5$\sigma$(Fo) | 4207 | 5860 | 4909 |
| std. rflns. | 3 std/197 rflns | 3 std/197 rflns | 3 std/197 rflns |
| var. in stds., % | <1 | 2 | <1 |
| (c) Refinement | | | |
| R (F), % | 4.85 | 4.30 | 4.63 |
| R (wF), % | 5.34 | 4.64 | 4.85 |
| $\Delta/\sigma$ (max) | 0.086 | 0.006 | 0.056 |
| $\Delta(\rho)$, eÅ$^{-3}$ | 0.635 | 1.321 | 1.063 |
| $N_o/N_v$ | 11.10 | 18.03 | 12.52 |
| GOF | 1.415 | 1.273 | 1.180 |

Also with reference to the barium diketonate tetraglyme adducts of FIGS. 1–3, Table III below sets forth the bond distances, in Angstroms, for the associated atomic pairs listed in the table for each of these species.

The bond angles for the barium $\beta$-diketonate tetraglyme adducts of FIGS. 1–3 are set out below n Table IV, with reference to the barium nuclear atom, and various other atomic triplets.

TABLE III

| FIG. 1 | | FIG. 2 | | FIG. 3 | |
|---|---|---|---|---|---|
| Ba—O(1) | 2.699(4) | Ba—O(6) | 2.689(3) | Ba—O(4) | 2.682(6) |
| Ba—O(2) | 2.718(60 | Ba—O(7) | 2.695(4) | Ba—O(3) | 2.664(4) |
| Ba—O(3) | 2.703(8) | Ba—O(8) | 2.717(3) | Ba—O(1) | 2.718(4) |
| Ba—O(4) | 2.698(4) | Ba—O(9) | 2.662(3) | Ba—O(2) | 2.668(4) |
| Ba—O(6) | 2.860(6) | Ba—O(1) | 2.863(4) | Ba—O(5) | 2.860(5) |
| Ba—O(7) | 2.834(11) | Ba—O(2) | 2.883(3) | Ba—O(6) | 2.891(5) |
| Ba—O(8) | 2.844(8) | Ba—O(3) | 2.866(4) | Ba—O(7) | 2.940(6) |
| Ba—O(9) | 2.826(6) | Ba—O(4) | 2.870(7) | Ba—O(8) | 2.911(5) |
| Ba—O(5) | 2.821(7) | Ba—O(5) | 2.851(4) | Ba—O(9) | 2.863(5) |
| O(1)—C(2) | 1.224(9) | O(6)—C(2) | 1.242(9) | O(4)—C(16) | 1.244(9) |
| C(2)—C(3) | 1.382(14) | C(2)—C(3) | 1.386(9) | C(16)—C(17) | 1.400(9) |
| C(3)—C(4) | 1.345(10) | C(3)—C(4) | 1.378(7) | C(17)—C(18) | 1.388(11) |
| C(4)—O(2) | 1.233(8) | C(4)—O(7) | 1.237(6) | C(18)—O(3) | 1.250(9) |
| C(2)—C(1) | 1.550(11) | C(2)—C(1) | 1.523(8) | C(16)—C(15) | 1.541(12) |
| C(4)—C(5) | 1.532(16) | C(4)—C(5) | 1.524(11) | C(18)—C(19) | 1.538(9) |
| O(3)—C(7) | 1.229(7) | O(8)—C(7) | 1.224(5) | O(1)—C(7) | 1.241(6) |
| C(7)—C(8) | 1.385(12) | C(7)—C(8) | 1.411(8) | C(7)—C(6) | 1.407(6) |
| C(8)—C(9) | 1.387(13) | C(8)—C(9) | 1.364(8) | C(6)—C(5) | 1.403(8) |
| C(9)—O(4) | 1.252(7) | C(9)—O(9) | 1.258(5) | C(5)—O(2) | 1.245(6) |
| C(7)—C(6) | 1.490(15) | C(7)—C(6) | 1.515(9) | C(7)—C(8) | 1.536(8) |
| C(9)—C(10) | 1.521(11) | C(9)—C(10) | 1.518(7) | C(5)—C(4) | 1.547(10) |

TABLE IV

| FIG. I | | FIG. II | | FIG. III | |
|---|---|---|---|---|---|
| Ba—O(1) | 2.699(4) | Ba—O(6) | 2.689(3) | Ba—O(4) | 2.682(6) |
| Ba—O(2) | 2.718(6) | Ba—O(7) | 2.695(4) | Ba—O(3) | 2.664(4) |
| Ba—O(3) | 2.703(8) | Ba—O(8) | 2.717(3) | Ba—O(1) | 2.718(4) |
| Ba—O(4) | 2.698(4) | Ba—O(9) | 2.662(3) | Ba—O(2) | 2.668(4) |
| Ba—O(6) | 2.860(6) | Ba—O(1) | 2.863(4) | Ba—O(5) | 2.860(5) |
| Ba—O(7) | 2.834(11) | Ba—O(2) | 2.883(3) | Ba—O(6) | 2.891(5) |
| Ba—O(8) | 2.844(8) | Ba—O(3) | 2.866(4) | Ba—O(7) | 2.940(6) |
| Ba—O(9) | 2.826(6) | Ba—O(4) | 2.870(7) | Ba—O(8) | 2.911(5) |
| Ba—O(5) | 2.821(7) | Ba—O(5) | 2.851(4) | Ba—O(9) | 2.863(5) |
| O(1)—C(2) | 1.224(9) | O(6)—C(2) | 1.242(9) | O(4)—C(16) | 1.244(9) |
| C(2)—C(3) | 1.382(14) | C(2)—C(3) | 1.386(9) | C(16)—C(17) | 1.400(9) |
| C(3)—C(4) | 1.345(10) | C(3)—C(4) | 1.378(7) | C(17)—C(18) | 1.388(11) |
| C(4)—O(2) | 1.233(8) | C(4)—O(7) | 1.237(6) | C(18)—O(3) | 1.250(9) |
| C(2)—C(1) | 1.550(11) | C(2)—C(1) | 1.523(8) | C(16)—C(15) | 1.541(12) |

TABLE IV-continued

| FIG. I | | FIG. II | | FIG. III | |
|---|---|---|---|---|---|
| C(4)—C(5) | 1.532(16) | C(4)—C(5) | 1.524(11) | C(18)—C(19) | 1.538(9) |
| O(3)—C(7) | 1.229(7) | O(8)—C(7) | 1.224(5) | O(1)—C(7) | 1.241(6) |
| C(7)—C(8) | 1.385(12) | C(7)—C(8) | 1.411(8) | C(7)—C(6) | 1.407(6) |
| C(8)—C(9) | 1.387(13) | C(8)—C(9) | 1.364(8) | C(6)—C(5) | 1.403(8) |
| C(9)—O(4) | 1.252(7) | C(9)—O(9) | 1.258(5) | C(5)—O(2) | 1.245(6) |
| C(7)—C(6) | 1.490(15) | C(7)—C(6) | 1.515(9) | C(7)—C(8) | 1.536(8) |
| C(9)—C(10) | 1.521(11) | C(9)—C(10) | 1.518(7) | C(5)—C(4) | 1.547(10) |
| Ba—O(1) | 2.699(4) | Ba—O(6) | 2.689(3) | Ba—O(4) | 2.682(6) |
| Ba—O(2) | 2.718(6) | Ba—O(7) | 2.695(2) | Ba—O(3) | 2.664(4) |
| Ba—O(3) | 2.703(8) | Ba—O(8) | 2.717(3) | Ba—O(1) | 2.718(4) |
| Ba—O(4) | 2.698(4) | Ba—O(9) | 2.662(3) | Ba—O(2) | 2.668(4) |
| Ba—O(6) | 2.860(6) | Ba—O(1) | 2.863(4) | Ba—O(5) | 2.860(5) |
| Ba—O(7) | 2.834(11) | Ba—O(2) | 2.883(3) | Ba—O(6) | 2.891(5) |
| Ba—O(8) | 2.844(8) | Ba—O(3) | 2.866(4) | Ba—O(7) | 2.940(6) |
| Ba—O(9) | 2.826(6) | Ba—O(4) | 2.870(7) | Ba—O(8) | 2.911(5) |
| Ba—O(5) | 2.821(7) | Ba—O(5) | 2.851(4) | Ba—O(9) | 2.863(5) |
| O(1)—C(2) | 1.224(9) | O(6)—C(2) | 1.242(9) | O(4)—C(16) | 1.244(9) |
| C(2)—C(3) | 1.382(14) | C(2)—C(3) | 1.386(9) | C(16)—C(17) | 1.400(9) |
| C(3)—C(4) | 1.345(10) | C(3)—C(4) | 1.378(7) | C(17)—C(18) | 1.388(11) |
| C(4)—O(2) | 1.233(8) | C(4)—O(7) | 1.237(6) | C(18)—O(3) | 1.250(9) |
| C(2)—C(1) | 1.550(11) | C(2)—C(1) | 1.523(8) | C(16)—C(15) | 1.541(12) |
| C(4)—C(5) | 1.532(16) | C(4)—C(5) | 1.524(11) | C(18)—C(19) | 1.538(9) |
| O(3)—C(7) | 1.229(7) | O(8)—C(7) | 1.224(5) | O(1)—C(7) | 1.241(6) |
| C(7)—C(8) | 1.385(12) | C(7)—C(8) | 1.411(8) | C(7)—C(6) | 1.407(6) |
| C(8)—C(9) | 1.387(13) | C(8)—C(9) | 1.364(8) | C(6)—C(5) | 1.403(8) |
| C(9)—O(4) | 1.252(7) | C(9)—O(9) | 1.258(5) | C(5)—O(2) | 1.245(6) |
| C(7)—C(6) | 1.490(15) | C(7)—C(6) | 1.515(9) | C(7)—C(8) | 1.536(8) |
| C(9)—C(10) | 1.521(11) | C(9)—C(10) | 1.518(7) | C(5)—C(4) | 1.547(10) |
| O(1)—Ba—O(2) | 63.7(1) | O(6)—Ba—O(7) | 64.8(1) | O(4)—Ba—O(3) | 64.50(1) |
| O(1)—Ba—O(3) | 144.8(2) | O(6)—Ba—O(8) | 144.0(1) | O(4)—Ba—O(1) | 140.1(1) |
| O(1)—Ba—O(4) | 149.2(2) | O(6)—Ba—O(9) | 147.9(1) | O(4)—Ba—O(2) | 142.7(2) |
| O(1)—Ba—O(6) | 106.4(1) | O(6)—Ba—O(1) | 81.1(1) | O(4)—Ba—O(5) | 116.3(1) |
| O(1)—Ba—O(7) | 93.0(2) | O(6)—Ba—O(2) | 75.4(1) | O(4)—Ba—O(6) | 83.9(2) |
| O(1)—Ba—O(8) | 74.0(2) | O(6)—Ba—O(3) | 74.2(1) | O(4)—Ba—O(7) | 72.0(2) |
| O(1)—Ba—O(9) | 74.0(2) | O(6)—Ba—O(4) | 92.5(1) | O(4)—Ba—O(8) | 73.6(2) |
| O(1)—Ba—O(5) | 85.4(2) | O(6)—Ba—O(5) | 108.6(1) | O(4)—Ba—O(9) | 76.4(2) |
| O(2)—Ba—O(3) | 151.2(1) | O(7)—Ba—O(8) | 151.2(1) | O(3)—Ba—O(1) | 153.3(1) |
| O(2)—Ba—O(4) | 89.5(1) | O(7)—Ba—O(9) | 88.7(1) | O(3)—Ba—O(2) | 90.0(1) |
| O(2)—Ba—O(6) | 69.7(2) | O(7)—Ba—O(1) | 71.6(1) | O(3)—Ba—O(5) | 70.0(2) |
| O(2)—Ba—O(7) | 111.5(2) | O(7)—Ba—O(2) | 118.7(1) | O(3)—Ba—O(6) | 93.6(2) |
| O(2)—Ba—O(8) | 135.7(2) | O(7)—Ba—O(3) | 136.9(1) | O(3)—Ba—O(7) | 129.4(2) |
| O(2)—Ba—O(9) | 115.8(2) | O(7)—Ba—O(4) | 111.6(1) | O(3)—Ba—O(8) | 127.4(2) |
| O(2)—Ba—O(5) | 73.1(2) | O(7)—Ba—O(5) | 70.9(1) | O(3)—Ba—O(9) | 81.7(1) |
| O(3)—Ba—O(4) | 63.9(2) | O(8)—Ba—O(9) | 64.6(1) | O(1)—Ba—O(2) | 63.7(1) |
| O(3)—Ba—O(6) | 91.8(2) | O(8)—Ba—O(1) | 108.0(1) | O(1)—Ba—O(5) | 97.4(1) |
| O(3)—Ba—O(7) | 72.0(2) | O(8)—Ba—O(2) | 86.7(1) | O(1)—Ba—O(6) | 98.7(2) |
| O(3)—Ba—O(8) | 71.2(2) | O(8)—Ba—O(3) | 70.4(1) | O(1)—Ba—O(7) | 76.7(2) |
| O(3)—Ba—O(9) | 84.6(2) | O(8)—Ba—O(4) | 73.0(1) | O(1)—Ba—O(8) | 68.7(2) |
| O(3)—Ba—O(5) | 106.1(2) | O(8)—Ba—O(5) | 91.4(1) | O(1)—Ba—O(9) | 93.8(1) |
| O(4)—Ba—O(6) | 75.4(2) | O(9)—Ba—O(1) | 73.2(1) | O(2)—Ba—O(5) | 76.1(1) |

Thus, by the practice of the present invention, the problems associated with the inherent low volatility and poor thermal stability of Group IIA beta-diketonates per se, which heretofore has been an obstacle to the efficient use of such compounds for chemical vapor deposition of barium therefrom, have been overcome, by complexing such compounds with suitable ligands. At temperatures greater than 200° C., such as are required to achieve a sufficient vapor pressure of Group IIA compounds per se, thermal decomposition occurs which is adverse to the effective utilization of such compounds in chemical vapor deposition applications. The adducts of the present invention, by contrast, permit higher volatility at lower temperature levels to be achieved, relative to the corresponding Group IIA metal beta-diketonate compounds, per se. The complexing approach of the present invention is usefully employed with beta-diketonates, as well as other organo compounds, of metal species including barium, calcium, strontium, yttrium, and copper. In the beta-diketonate or other organometal complexes, the presence of bulky substitutents such as t-butyl or perfluoroaklyl in the organo moiety is generally desirable to increase the volatility of the resulting metal complexes, relative to corresponding complexes wherein carbon atom substituents in the organo moiety are less bulky species, such as hydrogen or methyl.

In the practice of the present invention, complexing the Group II metal organic compounds with neutral coordinating oxygen donor ligands results in substantially enhanced volatility of the resulting complexes relative to the corresponding metal organic compounds per se, which in turn permits a uniform gas-phase mass transfer of the Group IIA metal moiety to be achieved in CVD applications over extended operating times.

By way of specific example the Group IIA beta-diketonate tetraglyme complexes of the present invention, or complexes with related neutral coordinating oxygen donor ligands, viz., of the formula $CH_3O(CH_2)C-H_2O)_nCH_3$, wherein n is an integer of from 1 to 6, are variously sublimable at temperatures on the order of from about 85° C. to about 150° C., and at pressures on the order of from about 0.05 to about 0.5 mm Hg.

Such barium beta-diketonate tetraglyme adducts may be employed to form homogeneous layers of 123 HTSC materials on suitable substrate materials, such as alumina (100) or MgO (100), at deposition temperatures on the order of 800° C.-950° C., with the resulting HTSC films being for example on the order of from about 0.05 micron to 1.0 micron or even greater thicknesses.

When fluorinated beta-diketonate complexes of Group II metals are employed to form copper oxide HTSC layers on substrates in the broad practice of the present invention, the fluorine desirably is stripped from the film in a wet oxygen atmosphere at suitable elevated temperature, followed by annealing of the film in dry oxygen at elevated temperature.

The source reagent complexes of the present invention are readily synthesized by organic synthesis techniques comprising conventional procedures for forming the compounds (subcomplexes), which then are reacted with complexing agents to yield the desired product complexes, or otherwise by concurrently or in other sequential fashion reacting the reactant materials to form the product complexes. Any such suitable procedures may be employed to yield highly pure products. All synthetic procedures may be performed using standard inert atmosphere techniques. The product complexes are readily characterizable using gas chromatography (GC), gas chromatography/mass spectrometry (GC/MS), nuclear magnetic resonance (nmr) spectroscopy, and elemental analysis.

Examples of complexing (e.g., chelating) ligands that have proven particularly effective in the broad practice of the present invention include tetraglyme, bipyridine, diglyme, and crown ethers such as 18 crown 6.

Group II compounds which are particularly preferred in the broad practice of the present invention for complexing with suitable ligands to produce enhanced volatility source reagents for chemical vapor deposition applications include: barium hexafluoroacetylacetonate, or $Ba(hfacac)_2$; barium bis (1,1,1,2,2,3,3-heptafluoro-7,7-dimethyl-4,6-octanedionate), or $Ba(fod)_2$; barium bis (2,2,6,6-tetramethyl-3,5-heptanedione), or $Ba(thd)_2$; and their strontium, calcium, and magnesium analogs, as well as mixtures comprising two or more of such compounds.

Formation of Group II element-containing films from the source reagents of the present invention may suitably be carried out by chemical vapor deposition methods, to yield films with superior physical properties, e.g., stoichiometry, superconducting transition temperature, crystallinity, and the like. Although the source reagent complexes of the present invention have significantly improved volatility over previously used compounds, it will be appreciated that such source reagent complexes are typically solids at STP conditions, and their controlled delivery into the reactor chamber requires heating of the delivery zone.

CVD reactors which may be employed for use of the metalorganic source reagents in the practice of the present invention are advantageously constructed with heated delivery zones which permit independent temperature control of each elemental source reagent bubbler, the mixing manifold, and the source reagent injection system (which introduces the vapor-phase source reagent to the reactor chamber) to be maintained. The mixing manifold and injector preferably are maintained at a temperature above the highest bubbler temperature (e.g., about 10° C. above such temperature) to prevent condensation of source reagents therein.

A flash vaporization delivery system particularly suitable for delivery of barium source reagents is disclosed and claimed in copending U.S. patent application Ser. No. 07/549,389 filed Jul. 6, 1990 and is described more fully hereinafter.

Figure 4:
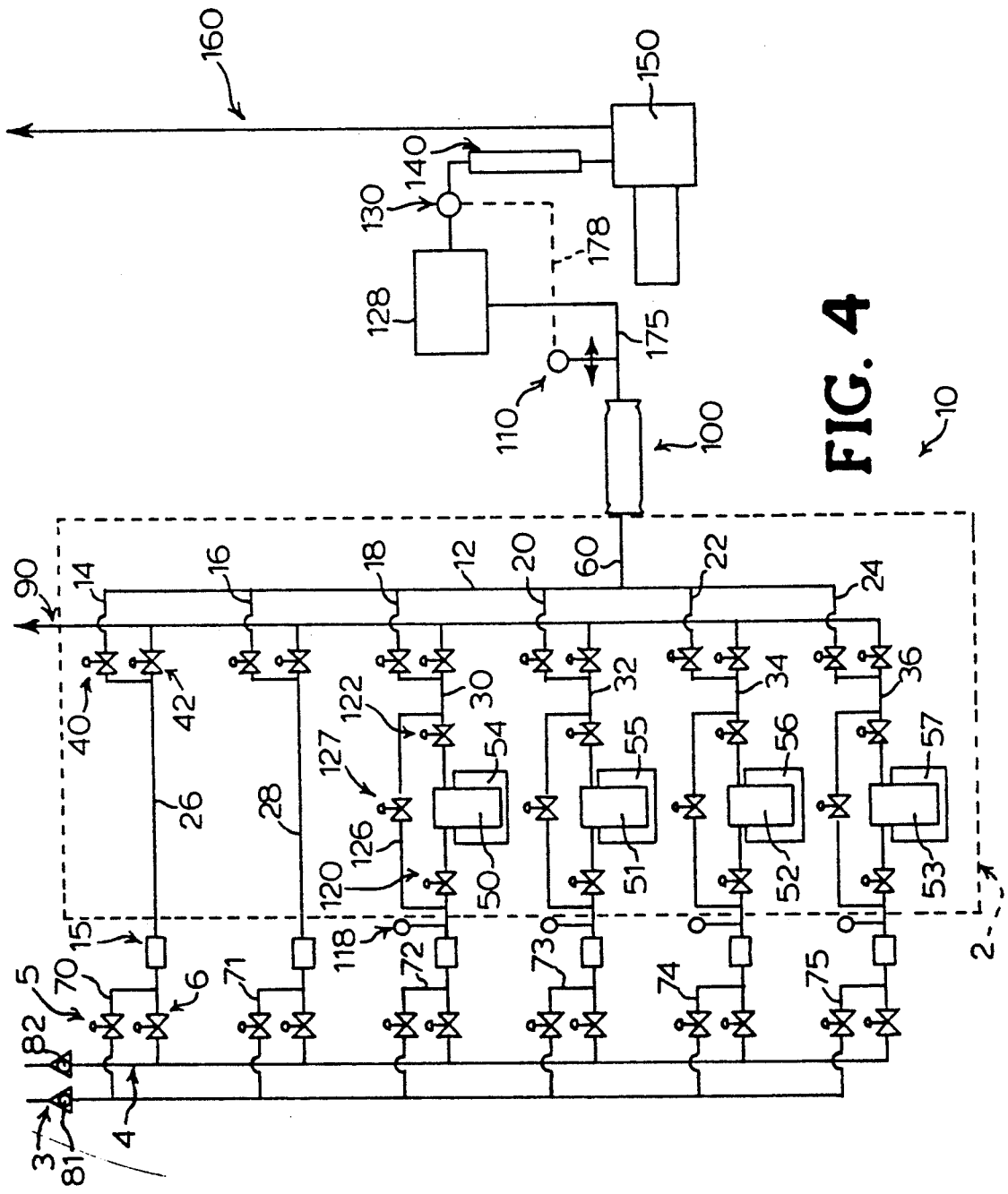
FIG. 4 is a schematic representation of a process system which may be employed for growth of HTSCs using suitable source reagents, such as the compounds and complexes of the present invention.

Referring now to the drawings, FIG. 4 shows an illustrative reactor system which may advantageously be used for deposition of superconducting thin films, e.g., of YBaCuO, BiSrCaCuO, or TlBaCaCuO.

As shown in FIG. 4, the reactor system 10 comprises a chemical vapor deposition reactor 100 comprising an injector tube (not shown in FIG. 4 but described more fully hereinafter) joined in flow communication with source gas feed conduit 60. The source gas feed conduit 60 in turn is joined to source reagent supply manifold 12, which in turn is connected by branch lines 14, 16, 18, 20, 22, and 24 to the respective main conduits 26, 28, 30, 32, 34, and 36. Each of the branch lines 14, 16, 18, 20, 22, and 24 has an automatic valve 40 disposed therein, and each of the main conduits 26, 28, 30, 32, 34, and 36, downstream of the connection of such conduit to the branch line, contains an automatic valve 42. Disposed in the main conduits 30, 32, 34, and 36 are respective "bubblers" (reagent containers) 50, 51, 52, and 53. The bubblers feature associated temperature-controlled jackets equipped with heating coils, as heating assemblies 54, 55, 56, and 57. The main conduits 26, 28, 30, 32, 34, and 36 are each joined at their outlet ends to a vent line 90 as shown.

At their inlet ends, main conduits 26, 28, 30, 32, 34, and 36 are joined to gas feed line 4. These main conduits 26, 28, 30, 32, 34, and 36 also are provided at their inlet portions with respective inlet branch lines 70, 71, 72, 73, 74, and 75, by which the main conduits are joined to gas feed line 3.

The respective gas feed lines 3 and 4 may be equipped with feed line control modules 81 and 82, respectively. These control modules may comprise conventional regulators, flow control valves, and/or any other suitable apparatus for controlling the process conditions (e.g., temperature, pressure, flow rate, and/or composition) of the gases introduced in the respective gas feed lines 3 and 4 to the reactor system.

Each of the inlet branch lines 70, 71, 72, 73, 74, and 75 contains an automatic valve 5. Each of the main conduits 26, 28, 30, 32, 34, and 36 at its inlet portion and upstream from its connection with the inlet branch line, contains an automatic valve 6. Each of such main conduits also contains a mass flow controller 15, as shown.

Each of the jacketed reagent containers has associated with it, in the appertaining main conduit, automatic valves 120 and 122, respectively upstream and downstream in relation to the jacketed reagent container. Each jacketed reagent container and main conduit also has associated with it a bypass line 126 containing a manual bypass valve 127.

The dashed-line rectangle 2 shown in FIG. 4 is intended to denote an oven, or other elevated temperature enclosure, which is controllably maintainable at selected temperature by suitable heating and control means (not shown). The oven thus encloses the jacketed reagent containers and associated piping and valves which are shown interior to the dashed-line retangle 2 in FIG. 4.

Downstream of the mass flow controller 15 in each of the main conduits 30, 32, 34, and 36 is disposed a pressure gauge 118, or other pressure sensing or monitoring means, so that pressure can be monitored at such portions of the main conduits. It will be recognized that the pressure sensing or monitoring apparatus may be arranged with respect to the mass flow controller 15 upstream thereof to selectively maintain a predetermined pressure level in the feed gas being flowed to the jacketed reagent container.

As indicated, the deposition reactor 100 as indicated is joined in closed flow communication with source gas feed conduit 60. At its outlet end the deposition reactor is joined in closed flow communication with gas discharge line 175, containing pressure monitoring means 110, e.g., a pressure gauge, or other sensing or monitoring means, therein. The gas discharge line 175 is joined to vacuum pump 150, and contains a particulate trap 128, a pressure control valve 130, and an oil trap 140, as shown. The pressure control valve 130 may suitably comprise a valve actuator element which is joined in signal controlling relationship, via signal transmission line 178, to the pressure sensing means, whereby a selected pressure level is maintained in the gas discharged from the deposition reactor 100. The vacuum pump 150 at its discharge end is joined to exhaust line 160, as shown.

As previously mentioned, the source gas feed conduit 60 may suitably terminate in an injector tube (not shown) for introducing gas to the deposition reactor 100. The length and internal diameter of the injector tube may be widely varied, as necessary or desirable to achieve optimal results for film formation in the reactor, in a given application. This injector tube suitably protrudes into the deposition reactor, to minimize the contact time of organometallic constituents with oxidizing gas upstream of the susceptor (not shown in FIG. 4) in the reactor.

In use, the reactor system 10 is readied for operation by first flushing an inert gas such as argon or nitrogen through the reactor and lines. Such flushing gas may be introduced to the system in feed line 3 and is flowed through the reagent containers and discharged from the system in vent line 90. During this flushing or purging step, valves 5 and 42 are open, and valves 6 and 40 are closed.

Independently, the temperature of the susceptor (not shown in FIG. 4) in deposition reactor 100 is raised to a selected temperature level for film growth, e.g., 500° C. When the temperature of the susceptor has stabilized, valves 6 are opened, concurrent with the introduction of co-reactant gas, e.g., oxygen, into gas feed line 4, and simultaneously valves 40 are opened and valves 42 are closed. During all of this time, valves 127 are closed and valves 120 and 122 are open.

As a result of the aforementioned switching of valves and introduction of carrier gas to gas feed line 4, carrier gas is flowed through the reagent containers 50, 51, 52, and 53 to form a corresponding carrier gas/source reagent vapor stream which is flowed into the source reagent supply manifold 12 and source gas feed conduit 60 to deposition reactor 100, to deposit the depositable element from the vaporized source reagent on a suitable substrate (not shown) mounted or otherwise positioned in the reactor.

When growth of the deposited film is complete, valves 120 and 122 are closed, so that the passage of source reagent vapor into the carrier gas is discontinued, while the deposition reactor 100 continues to be purged with gas from gas feed lines 3 and/or 4, depending on the gas flows through the system which are desired at such point of operation.

In instances where the gas introduced in gas feed line 3 is an inert gas, such as nitrogen or argon, and the gas introduced in gas feed line 4 is oxygen, such as is desirably the case when metal oxide high temperature superconducting films are being formed in the deposition reactor 100, the gas from the gas feed lines 3 and 4 may be by-passed around the jacketed reagent containers 50, 51, 52, and 53, by closure of valves 120 and 122 and opening of vales 127. In this manner, the deposition reactor 100 continues, to be purged with oxygen for a period of time sufficient to insure that all metals in the deposited film are present in their oxidized form. After such oxygen purging has been completed, oxygen flow from gas feed line 4 is discontinued, by closure of valves 6, and inert gas flow continues through the system during the subsequent cool-down phase. In this manner, the deposition reactor and associated piping and valves through which inert gas is flowed, are cooled to ambient or other suitable lower temperature, relative to the high temperatures which are characteristic of CVD film growth operation.

The temperature, pressure, and flow rate conditions employed in the reactor system 10 shown in FIG. 4 may suitably be selected to facilitate close stoichiometric control of the film being deposited, and such process conditions may readily be determined by those of ordinary skill without undue experimentation, by growth studies of the appertaining films sought to be grown. In general, relatively low growth temperatures are desired, to insure minimal interaction between the substrate and overlying films.

In the system shown in FIG. 4, the source gas feed conduit 60 which conveys the hot organometallic vapor streams into the reactor advantageously comprises an injector (not shown for clarity in FIG. 4, but which is more fully described hereinafter), which minimizes the contact time of the hot organometallic vapors with the oxidizing gas upstream of the susceptor.

In HTSC film growth applications, the length of the injector tube into the reactor which gives the best thin film morphology ranges may readily be determined by experimetation without undue effort for a given reactor chamber. Double wall reactor tubes are advantageously used, and the inner walls may be suitably maintained at a desired elevated temperature, e.g., 200° C., with a hot air or other elevated temperature gas stream; control may suitably be achieved with a simple proportional controller which regulates the voltage applied to the heating element of a hot gas blower. This choice of reactor configuration/heating prevents condensation of source reagents on reactor walls upstream of the susceptor, minimizes parasitic wall reactions, and eliminates any stray convectively driven flows caused by nonuniformities in the reactor wall temperature. Wall reactions are to be avoided, or at least minimized, since they lead to particulate formation, and to the nonuniform depletion of source reagent deposition elements from the vapor phase before reaching the susceptor, which makes the exacting control of the stoichiometry in the growing oxide film nearly impossible.

Figure 5:
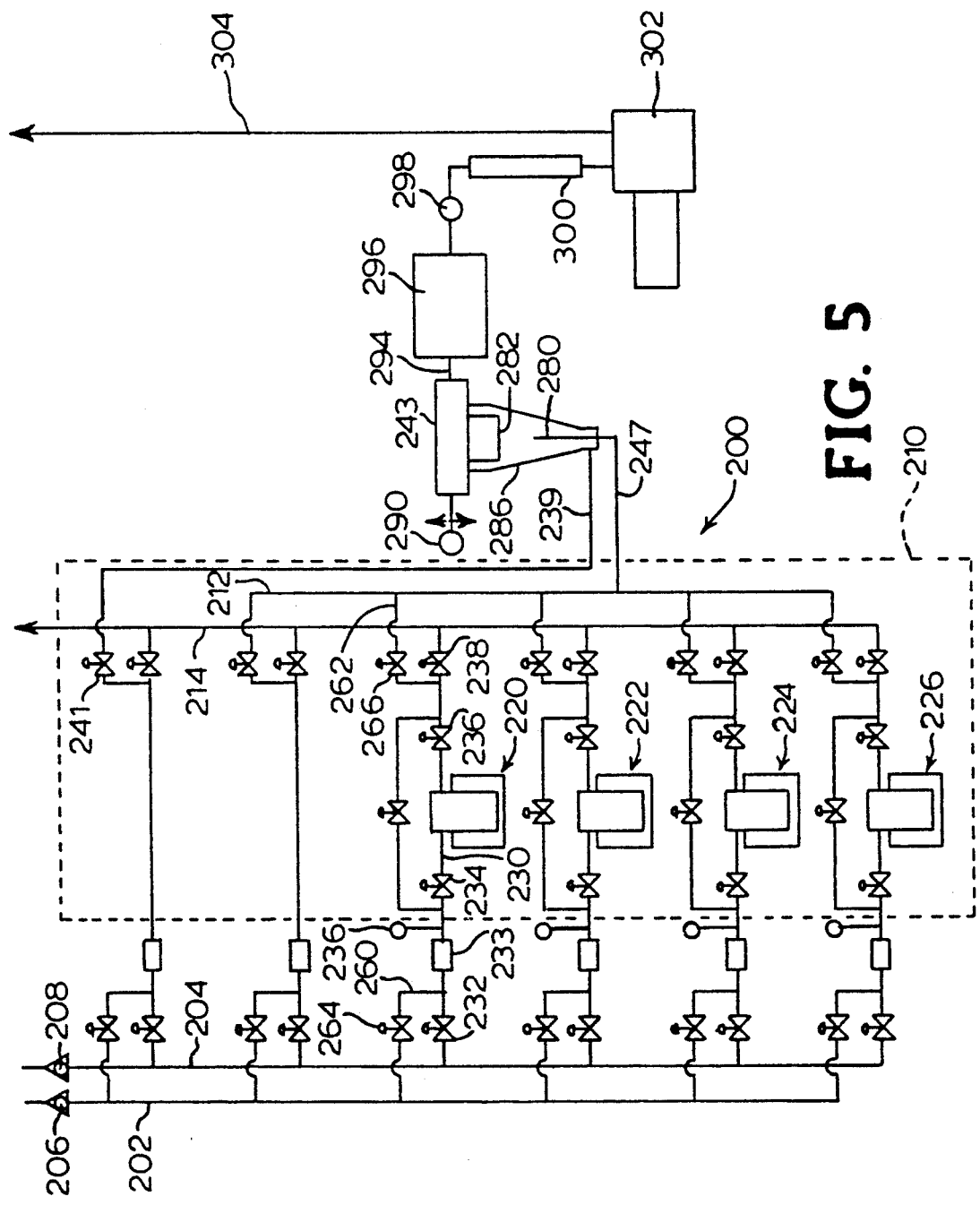
FIG. 5 is a schematic representation of another illustrative deposition reactor system which may be employed in the broad practice of the present invention.

FIG. 5 is a schematic representation of a reactor system according to another embodiment of the present invention, which may usefully be employed to form thin films by chemical vapor deposition from source reagents, such as those illustratively discussed in the Examples set forth hereinafter.

Referring more specifically to the drawing, the illustrated reactor system 200 of FIG. 5 comprises an oven or other temperature controlled structure 210 serving to maintain the equipment and conduits therein (as depicted within the dashed-line in the drawing) at a selected temperature, which may for example be in the range of from about 25° C. to about 250° C., as necessary or desirable in a given end use application.

The piping, manifolding, and valving of the system in FIG. 5 is generally similar to that described in FIG. 4. The FIG. 5 system comprises gas feed lines 202 and 204, for introduction of gases such as argon and oxygen, respectively. Gas feed line 202 is equipped with flow monitoring and/or control means 206, and gas feed line 204 similarly features flow monitoring and/or control means 208, which may serve the same function as the corresponding means described hereinearlier with reference to FIG. 4 hereof.

The FIG. 5 system further comprises within the oven 210 a reagent source gas manifold 212, a vent conduit 214, and a series of parallelly arranged jacketed reagent containers 220, 222, 224, and 226. Each of these jacketed reagent containers is disposed in a corresponding main conduit 230, having flow control valves 232, 234, 236, and 238 associated therewith. The main conduits 230 in turn are joined to gas feed line 202 and to source gas product manifold 212, by means of branch lines 260 and 262, respectively. The respective branch lines contain valves 264 and 266, as shown. Each of the main conduits 230 also has disposed therein a mass flow controller 233, and pressure transducer 235, which may be coupled to one another (and/or coupled to other control means) for monitoring and/or control of the gas being fed to the reagent containers in the main conduits.

Joined to the uppermost main conduit in the FIG. 5 system is a dilution gas feed line 239 having flow control valve 241 disposed therein. The dilution gas feed line 239 functions to adjust the flow rate of inert gas which functions as a diluent for the source reagent gas mixture introduced to the deposition reactor 243 in source reagent gas mixture feed conduit 247. The source reagent gas mixture feed conduit as shown comprises an injector tube 280, for discharging of the source reagent gas mixture in proximity to the susceptor 282 within the reactor. The deposition reactor 243 shown in FIG. 5 is an upflow reactor, having an upwardly and outwardly flaring housing 286, for purposes of obtaining a laminar flow distribution of source reagent gas mixture in the reactor, to achieve stagnation point flow at the susceptor which gives rise to a highly uniform thickness and composition of the growing film on the surface of susceptor 282.

Deposition reactor 243 may advantageously be equipped with a pressure gauge 290 or other pressure monitoring and/or control means, whereby the pressure level of the reactor is readily maintained at a suitable level for the desired film growth operation. The deposition reactor 243 is joined by effluent gas discharge conduit 294 to a particulates trap 296. This trap removes fine solids from the effluent gas, and the effluent gas then is passed through pressure control valve 298 to oil trap 300, and finally to the intake of vacuum pump 302, which is connected at its discharge end to exhaust conduit 304. The vacuum pump 302 may be of any suitable type, and desirably has sufficient capacity to insure good flexibility of operation in establishing desired pressures in the reactor and other upstream components of the system. The vacuum pump may for example have a volumetric exhaust capacity of about 30 cubic feet per minute at standard temperature and pressure (25° C., 1 atmosphere) ("STP") conditions.

The deposition reactor 243 is suitably constructed with heated delivery zones which allow independent temperature control of each elemental source reagent container (bubbler), as well as the mixing manifold, and the organometallic source reagent injection system. As previously discussed, the mixing manifold and injector are desirably maintained a suitable increment, e.g., 10° C., above the temperature source of the highest temperature source reagent container, in order to prevent the condensation of the source reagents.

The injector tube 280 extends into the reactor as shown, in order to minimize the contact time of the source gas mixture with the oxidizing gas upstream of the substrate on which the desired film is being grown.

In the broad practice of the present invention, any suitable deposition reactor configuration and heating method may be employed. Examples of suitable deposition reactor and heating modalities include horizontal reactors with infrared (IR) heating, vertical reactors with resistive heating, and vertical reactors with inductive heating. For example, the reactor may be of an inverted vertical form, as is more fully described in U.S. Pat. No. 4,732,110, the disclosure of which hereby is incorporated herein.

Figure 6:
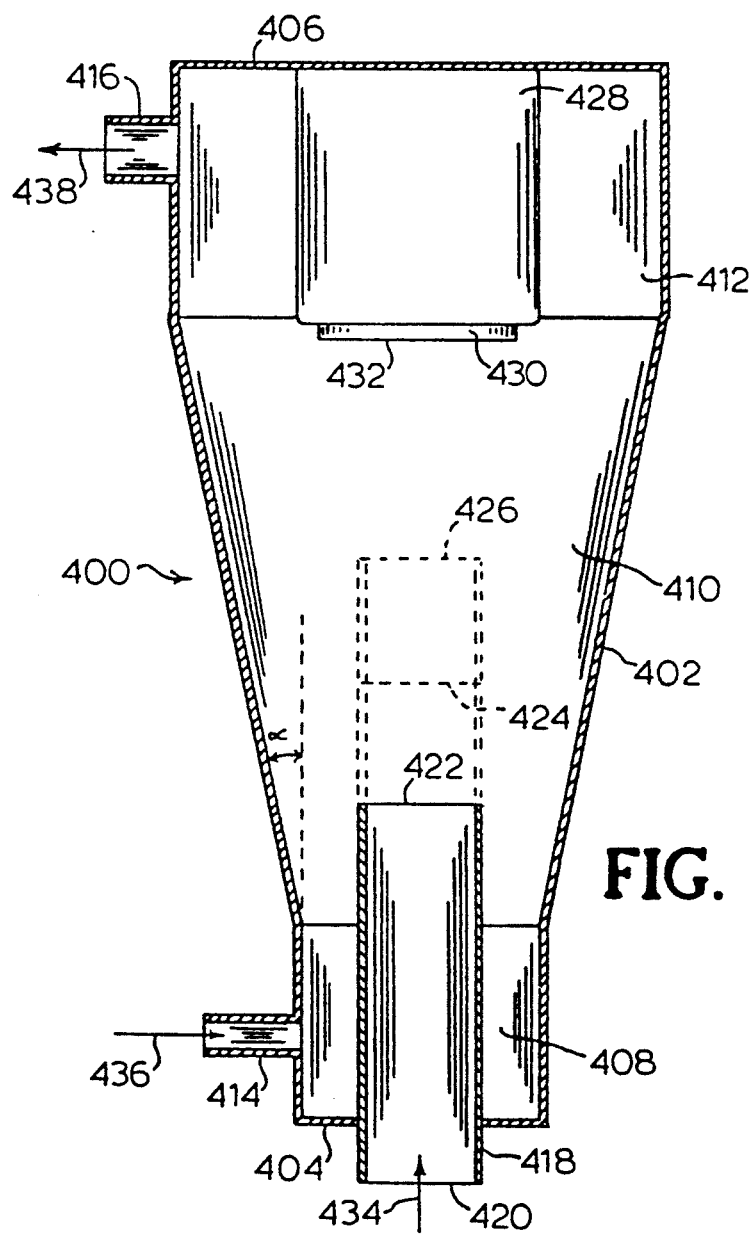
FIG. 6 is an elevation view, in partial cross-section, of a chemical vapor deposition reactor suitable for use in performing CVD in the broad practice of the present invention.

A particularly preferred inverted vertical reactor configuration is shown in FIG. 6, which is a partially sectioned, elevation view of a deposition reactor 400.

The reactor 400 comprises a housing 402 which may be formed of any suitable material, e.g, quartz, and which defines a lower cylindrical portion 408 enclosed by lower end wall 404, an intermediate upwardly and outwardly flaring portion 410, and an upper cylindrical portion 412 enclosed by upper wall 406.

The lower cylindrical portion 408 of the reactor is provided with a laterally extending inlet passage 418. The upper cylindrical portion 412 of the reactor similarly features a laterally extending outlet passage 416.

Extending through the lower end wall 404 of housing 402 is an injector tube 418 which is open at its lower and upper ends, 420 and 422, respectively. The injector tube 418 may be arranged in the housing 402 so as to be axially movable, whereby the upper open end of the tube may be coincident with dashed-line 424, or dashed-line 426, or other suitable position axially displaced from that shown in FIG. 6. Alternatively, the injector tube 418 may be constructed so as to be selectively removable from housing 402 and replaceable with other injector tubes of greater axial extent (length).

In the upper cylindrical portion 412 of the reactor, a pedestal 428 is secured to the upper end wall 406 of the housing. On its lower horizontal surface, a wafer 430 or other substrate element is mounted or otherwise disposed, to present a main deposition surface 432 to the source reagent gas mixture flowed upwardly through the reactor.

Although the reactor shown in FIG. 6 may have any suitable dimensional characteristics, it typically is desirable, particularly in applications such as HTSC film formation, to provide the housing 402 in the intermediate portion 410 of the reactor with an upwardly and outwardly flaring wall. The wall suitably defines a wall angle $\alpha$ as shown in FIG. 6, which is from about 5° to about 25°, and more preferably is from about 5° to about 15°. This wall angle is measured as the included angle between the wall at the intermediate portion of the housing, and an axially extending line coincident with the wall at the lower cylindrical portion of the reactor, with both "wall lines" in the same radial plane of the reactor housing. The diameter of the injector tube 418 is desirably sized relative to the diameter of the lower cylindrical portion 408 of the reactor, to provide a diametral ratio (i.e., ratio of the inner diameter of the injector tube 418 to the inner diameter of the lower cylindrical portion 408 of the reactor) of from about 0.5 to about 0.7, with the respective diametral values being measured in the same dimensional units.

The reactor may optionally comprise a housing 402 with a double wall, in place of the single wall illustratively shown in FIG. 6, to allow a heating medium (e.g., hot air) to be circulated through the interior volume between the two walls, to thereby heat the inner wall to a temperature above the condensation temperatures of the source reagents but below their decomposition temperatures.

While the specific dimensions of the reactor shown in FIG. 6 may comprise any suitable dimensional values consistent with the foregoing intermediate portion wall angle and diametral ratio criteria, a highly preferred reactor which has been effectively used to deposit HTSC films on wafer substrates has an injector tube with an inner diameter of 1.75 inches, a lower cylindrical portion 408 with an inner diameter of 3.0 inches, an upper cylindrical portion 412 with an inner diameter of 6 inches, an upper cylindrical portion 412 length (axial dimension) of approximately 6 inches, and an intermediate portion 410 length (axial dimension) of approximately 18 inches. The pedestal 428 may be appropriately configured as desired to provide a suitable mounting or positioning means for the substrate to be coated with the CVD'ed film, however the pedestal diameter (lateral extent) should be sufficient in relation to the diameter of the upper cylindrical portion 412 of the reactor to permit ready disengagement of the flowing gas stream from the pedestal, and collection of the residual gas for discharge from outlet passage 416. For this purpose, the pedestal (susceptor) 428 desirably has a diameter (lateral dimension) which is from about 0.5 to about 0.7 times the inner diameter of the upper cylindrical portion 412 of the reactor.

In the operation of the reactor shown in FIG. 6 for applying HTSC films to a wafer 430 disposed on pedestal 428, organometallic source reagent, suitably in the form of a gas mixture comprising a carrier gas such as argon, is introduced to the reactor through inlet passage 414 in the direction indicated by arrow 436. Such introduced gas mixture thus enters the lower cylindrical portion 408 of the reactor, in the annular space between the housing 402 at such portion of the reactor, and the concentrically mounted injector tube 418 disposed in such lower portion.

Concurrently, an oxidizing gas (oxygen, ozone, water vapor, etc.) is introduced into the injector tube 418 at the open lower end 420 thereof, in the direction indicated by arrow 434.

The gas species identified above as being introduced through open lower end 420 and inlet passage 414 of the reactor are merely illustrative. The purpose of such "dual inlet" arrangement is to segregate (in the separate streams being introduced) gas components which may otherwise prematurely react and adversely affect the deposition process, if they were mixed with one another prior to this introduction to the CVD reactor.

By this arrangement, the organometallic source reagent gas mixture and oxidizing gas enter in separate streams which flow upwardly in the reactor into the intermediate portion 410 thereof. In the intermediate portion, the organometallic source reagent gas mixture and oxidizing gas streams are joined and form a resulting reaction gas mixture which, by virtue of the geometry, and the upwardly and outwardly flaring structure of the intermediate portion of the reactor, the reaction gas mixture flows in a laminar flow fashion to the wafer 430 which is disposed on pedestal 428.

By this inverted vertical reactor configuration, particulates in the source reagent gas mixture and/or oxidizing gas flow streams are prevented from depositing on the wafer and pedestal.

After contacting the main deposition surface 423 of the wafer 430, the contacted reaction gas mixture flows into the annular volume between the pedestal and the housing wall at the upper portion of the reactor, and then is discharged from the reactor in outlet passage 416, in the direction indicated by arrow 438.

In order to most efficiently achieve stagnation point flow conditions in the reaction gas mixture at the main deposition surface of the wafer mounted in the reactor, it is desirable that the volumetric flow rates of the source reagent gas mixture and oxidizing gas mixture be adjusted relative to one another, such that the upward superficial gas velocity of the source reagent gas mixture in the annular volume of reactor lower portion 408 be equal to the upwardly superficial gas velocity of the oxidizing gas mixture flowed through injector tube 418. By equalizing the superficial gas velocities of the respective streams, e.g., so that same are within about 10% of one another, a close approach to ideal laminar flow conditions is achieved, with concomitant absence of any anomolous flow behavior, such as by-passing, flow short-circuiting, backflows, dead space formation, turbulence, eddy currents, cortex formation, recirculating cells, and the like.

A preferred class of the Group II metal source compounds which have been found to be highly suitable in the broad practice of the present invention for chemical vapor deposition applications, including the MOCVD formation of copper oxide HTSC films, has the following general formula:

$$MR_xL_yL'_z$$

wherein:
M is a metal selected from the group consisting of magnesium, calcium, strontium, and barium;
R is a multidentate ligand;
L and L' may be the same or different, and are neutral donor ligands;
x is 1 or 2; and
y and z are integers having zero or non-zero values, such that the sum y+z has a value
  (i) of from 1 to 8, inclusive, when x=2 and R are multidentate anionic ligands,
  (ii) of from 0 to 10, inclusive, when x=2 and R are perfluoro-t-butoxy, and
  (iii) of from 1 to 10, inclusive, when x=1 and R is a multidentate dianionic ligand.

Set out below in Table V is a listing of various illustrative CVD source reagent compounds within the broad practice of the present invention and the above general formula, together with the shorthand designations (as sometimes used hereinafter) and/or chemical formulae therefor.

TABLE V

| Name | Designation/Formula |
| --- | --- |
| barium bis (2,2,6,6-tetramethyl-3,5-heptanedionate) | Ba(thd)$_2$ |
| barium bis (2,2,6,6-tetramethyl-3,5-heptanedionate).(tetraglyme) adduct | Ba(thd)$_2$.(CH$_3$O(CH$_2$CH$_2$O)$_4$—CH$_3$) |
| barium bis (1,1,1,5,5,5-hexafluoro-2,4-pentanedionate) | Ba(hfacac)$_2$ |
| barium bis (1,1,1,5,5,5-hexafluoro-2,4-pentanedionate).tetraglyme adduct | Ba(hfacac)$_2$.(CH$_3$O(CH$_2$CH$_2$O)4—CH$_3$) |
| barium bis(1,1,1,2,2,3,3-heptafluoro-2,2-dimethyl-4,6-octanedionate | Ba(fod)$_2$ |
| barium bis (1,1,1,2,2,3,3-heptafluoro-2,2-dimethyl-4,6-octanedionate).(tetraglyme) adduct | Ba(fod)$_2$.(CH$_3$O(CH$_2$CH$_2$O)$_4$CH$_3$) |
| barium bis (pentamethylcyclopentadienyl).tetrahydrofuran adduct | (Cp$_2$*Ba).(thf) |
| barium bis (pentamethylcyclopentadienyl) | Cp$_2$*Ba |
| barium bis (acetylacetonate).tetraglyme adduct | Ba(acac)$_2$.(CH$_3$O(CH$_2$CH$_2$O)$_4$CH$_3$) |
| barium bis (1,1,1-trifluoro-2,4-pentanedionate).(tetraglyme) adduct | Ba(tfacac)$_2$.(CH$_3$O(CH$_2$CH$_2$O)$_4$CH$_3$) |
| calcium bis (2,2-dimethyl-6,6,7,7,8,8,8-heptafluoro-3,5-octanedionate) | Ca(fod)$_2$ |
| strontium bis (2,2-dimethyl-6,6,7,7,8,8,8-heptafluoro-3,5-octanedionate) | Sr(fod)$_2$ |
| yttrium tris (2,2,6,6-tetramethyl-3,5-heptanedionate) | Y(thd)$_3$ |
| copper bis (hexafluoroacetylacetonate) | Cu(hfacac)$_2$ |
| barium bis (cyclopentadienyl) | Cp$_2$.Ba |
| barium bis (cyclopentadienyl).tetraglyme adduct | (Cp$_2$Ba).tg |

It will be understood that the specific listing of compounds in Table V is intended to be illustrative in character, and that other corresponding compounds (analogs) within the broad practice of the present invention may be synthesized, with metal species other than those specifically shown. For example, analogs of the barium compounds listed in Table V may be synthesized with other Group II metals, such as strontium, calcium, or magnesium.

Accordingly, the Table V listing of compounds is intended to be illustrative only, and non-limiting in character, in setting forth exemplary compounds which are potentially usefully employed in the broad practice of the present invention.

In the use of barium as a Group II metal constituent in organogroup II compounds in the broad practice of the present invention, barium, as mentioned hereinabove, usually is found in the +2 oxidation state and formally has 2 ligands, although its coordination number can range to 8 or more. In view of the general associative tendencies of barium compounds, the present invention contemplates various means of disrupting the association to increase the volatility of the barium-containing material. Specifically, multidentate ligands capable of binding to a single barium atom may be employed to occupy sufficient coordination sites to disrupt association in the overall complex.

Barium source compounds which may be employed in the preferred practice of the present invention include barium alkyls, barium alkoxides, barium betadiketonates, barium cyclopentadienyls, barium perfluoroalkyls, and barium perfluoroalkoxides.

With respect to organogroup II source compounds generally, various metal-containing beta-diketonates, e.g., acetylacetonates, are volatile, including some barium, calcium, and strontium derivatives. For example, the barium complexes of 2,2,6,6-tetramethyl-3,5-heptanedione (Hthd) and 1,1,1,2,2,3,3-heptafluoro- 7,7-dimethyl-4,6-octanedione (Hfod) have limited volatility at elevated temperatures. Unfortunately, these barium compounds decompose at the temperatures which are generally required for sublimation (>190° C.), and are associated in the gas phase. Unpredictable gas phase association can in turn lead to difficulties in achieving and reproducing the desired gas phase transport of the source reagent into the CVD reactor.

Barium bis (2,2,2,3,3,4,4-heptafluoro-7,7-dimethyl-4,6-octanedionate), hereafter sometimes denoted Ba(fod)$_2$, has been reported to have the highest vapor pressure of any previously known barium organometallics. Synthesis of this compound by the previously known synthesis procedure, and study of the stability and decomposition of the resulting compound, has resulted in two key observations. First, residual water from the synthesis is extremely difficult to remove from Ba(fod)$_2$, even with repeated vacuum sublimations. Second, Ba(fod)$_2$ is thermally labile at temperatures above 150° C. and its decomposition is accelerated by the presence of water and oxygen. Use of Ba(fod)$_2$ as a CVD source reagent for deposition of barium therefore requires some care.

The previously known synthesis procedure for Ba(fod)$_2$ employs water as a solvent and uses Ba(OH)$_2$ and 1,1,1,2,2,3,3-heptafluoro-7,7-dimethyl-4,6-octanedione (Hfod) as the starting materials. Given the highly electropositive nature of barium, association of the product barium compound with trace amounts of water is almost inevitable. To obviate the thermal instability problems of Ba(fod)$_2$ that are exacerbated by water, a non-aqueous synthesis for this barium reagent compound has been devised, as described more fully hereinafter, which employs BaH$_2$ and Hfod as the starting materials. Ba(fod)$_2$ prepared by this method shows significantly increased thermal stability. The corresponding Ca and Sr complexes of fod may be analogously prepared. The general applicability of this non-aqueous synthetic method has been variously demonstrated for several illustrative acetylacetonate (acac) derivatives of barium, as described more fully hereinafter.

The problems of sensitivity to oxygen and water which are characteristics of Ba(fod)$_2$ and other barium compounds may be overcome in the broad practice of the present invention, by utilizing a novel barium source reagent delivery apparatus and method in the CVD system, as described more fully hereinafter. Using such delivery system, barium can be transported, e.g., with pure Ba(fod)$_2$ as the source reagent, at a reproducible and predictable flux into the CVD reactor, whereby films of superior character are readily grown.

As an illustration of the preparation of Group II metal source reagent complexes in the practice of the present invention, set out below is a description of the preparation and characterization of various amine complexes of three illustrative barium beta-diketonates: barium bis (2,4-pentanedionate), denoted Ba(acac)$_2$; barium bis (1,1,1,2,2,3,3-heptafluoro-7,7-dimethyl-4,6-octanedionate), denoted Ba(fod)$_2$; and barium bis (1,1,1,5,5,5-hexafluoro-2,4-pentanedionate), denoted Ba(hfacac)$_2$. The amines employed to form barium source reagent complexes were selected to span a wide range of electronic and steric properties. Typically the adducts were prepared by dissolving the barium diketonate compounds in an alcohol and adding the coordinating amine with stirring. Solvent was removed in vacuo and the solid collected. The results of these preparations and characterizations are summarized in Table VI below.

The barium acetylacetonate amine complexes produced by this methodology were usually white solids that melted over a 2°–3° C. range. Although they were not all characterized by nuclear magnetic resonance (nmr) studies, the complexes appeared to be true adducts and not mixtures.

TABLE VI

| | | Barium Acetylacetonate Amine Complexes | | |
|---|---|---|---|---|
| | | Ba(C$_5$H$_7$O$_2$)$_2$ | Ba(C$_3$F$_7$COCHCOC(CH$_3$)$_3$)$_2$ | Ba(CF$_3$COCHCOCF$_3$)$_2$ |
| (CH$_3$)$_2$NCH$_2$CH$_2$N(CH$_3$)$_2$ | bp 120–122° C. | White needles | Colorless crystals, mp. 112–115° C. sublimes at 135° C. to regenerate parent acac, dec. 160° C. | White Solid |
| (CH$_3$)$_2$NCH$_2$CH$_2$NH$_2$ | bp 104–106° C. | White solid, dec 220° C. | Colorless solid mp. 70–75° C. dec. 190° C. | No reaction |
| (CH$_3$)$_2$NCH$_2$CH$_2$CH$_2$NH$_2$ | bp 133° C. | White solid. | No reaction | No reaction |
| H$_2$NCH$_2$CH$_2$NCH$_2$CH$_2$NH$_2$ (H) | bp 199–209° C. | | 1d Cream solid mp. 128–130° C. partial sublimation 135° C. at 250 | 2d White powder mp 96° C. Dec. 130° C. |
| 2,2'-bipyridine | mp 70–73° C. | White solid dec. 214° C. | See text | White solid partial sublimation 120° C. (decs.) |
| 4,4'-bipyridine | mp 105–108° C. | White solid dec. 210° C. | Light yellow solid mp. 148–152° C. dec. upon melting | |
| di(2-pyridyl)amine | mp 95–97° C. | | Cream solid mp. 110° C. partial sublimation 135° C. at 250 mp | Pale brown solid 73–75° C., dec. 91° C. |
| di(2-pyridyl)ketone | mp 53–55° C. | | Beige solid mp. 98–102° C. dec. 115° C. | |
| CH$_3$–C(OH)(2-pyridyl)–C(OH)(CH$_3$)(2-pyridyl) | mp 142–143° | | No reaction | White powder mp 122–127° C. dec. 120° C. |

TABLE VI-continued

| Barium Acetylacetonate Amine Complexes | | |
|---|---|---|
| $Ba(C_5H_7O_2)_2$ | $Ba(C_3F_7COCHCOC(CH_3)_3)_2$ | $Ba(CF_3COCHCOCF_3)_2$ |
| 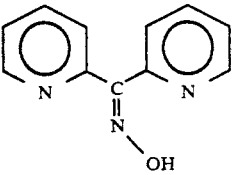<br>mp 113–114° C. | White glassy solid<br>mp 125° C., partial sublimation 130° C.<br>dec. 150° C. | White solid mp. 98–100° C.<br>dec. 110° C. |

These adducts were screened for volatility by placing a sample thereof in a single-ended glass tube (¼ inch outer diameter) and attaching a vacuum manifold to the open end of the tube. The tube was evacuated, placed in an oil bath, and the temperature of the bath was raised. The temperature at which the solid melted, sublimed (or boiled), or decomposed (as detected by visual inspection) was noted. In some instances, partial sublimation occurred or heating caused displacement of the diamine or triamine complex prior to sublimation. Of all the adducts which were studied, a 2,2-bipyridine (bipy) adduct of barium bis (1,1,1,2,2,3,3-heptafluoro-7,7-dimethyl-4,6-octanedionate) appeared to possess the best properties and was further studied. Sublimation of the crude adduct of this composition at 145° C. gave a white solid in low yield. This sublimed material could be melted and resublimed. The presence of barium in the compound and the sublimate was confirmed by observing a white precipitate upon addition of the compound or the sublimate to dilute sulfuric acid. 1H nmr of the compound showed the presence of barium bound 2,2'-bipyridine and 1,1,1,2,2,3,3-heptafluoro-7,7-dimethyl-4,6-octanedionate, as evidenced by the shift in the resonance of the protons adjacent to the coordinated nitrogen and attached to the central atom of the acetylacetonate. The ratio of bipy:fod:Ba appeared to be approximately 4:2:1 based on the values of the integrated peak intensities.

The thermal behavior of the barium acetylacetonate (acac) amine adduct was investigated to determine its suitability for use in an MOCVD system. Prolonged exposure (>4 hours) of the adduct to 145° C. and moderate vacuum resulted in decomposition of the complex, as evidenced by a discoloration and an incomplete sublimation. 2,2'-Bipyridine was slowly removed from the adduct at elevated temperatures (T>100° C.) under high vacuum (<50 microns). Thus, although barium can be efficiently transported using this adduct, its thermal instability renders it generally unsuitable for use in an MOCVD system.

Nonetheless, the synthesis and characterization of such barium compound/amine complexes clearly demonstrate that volatile barium compounds can be prepared via coordination with a multidentate ligand that disrupts association.

Decomposition of the above described amine adducts appears to proceed via loss of the amine and regeneration of the parent acac. This pathway may be circumvented if the acac and the amine are present in the same molecule, such as by incorporation of the acacs in a single cyclic or acyclic compound containing sufficient coordinating atoms to prevent barium association.

Schiff bases may be prepared from the reaction of Hacac and Hfod with a series of linear diamines. The resulting Schiff bases are solids which can be filtered from the reaction mixtures and purified by sublimation. Procedures analogous to the preparation of the Ba acac complexes can be used to prepare Schiff base:Ba complexes. Soluble Ba complexes can be obtained from Schiff bases derived from Hfod and 1,2-ethylenediamine and 1,3-propanediamine. These soluble barium complexes decompose without subliming upon heating in vacuo at temperatures below 125° C.

The present invention also comprehends the use of macrocyclic acac ligands to bind barium and to impart volatility, since the bond strength of the macrocyclic acac compound to barium is substantially higher than the corresponding bond strength for the acyclic monomeric acac. The use of macrocyclic acacs permits derivatization (e.g., with fluorine) that may potentially increase the volatility of the resulting complexes.

With repect to barium alkyls as barium source compounds, various barium alkyls have been prepared in solution but typically such compounds are not isolated, because of their thermal instability, tendency for coordination to the solvent, and extreme reactivity towards water and oxygen. However, this reactivity towards water and oxygen is a desirable feature if the barium alkyl compound permits the formation of barium oxide at low temperatures.

Controversy exists over whether the simplest member of the alkylbarium series, $Ba(CH_3)_2$, is stable at room temperature. Isolated aryl barium and alkynyl barium compounds are insoluble in non-polar solvents, but do dissolve in electron pair donating polar solvents such as tetrahydrofuran (THF). This solubility behavior is consistent with a highly associated structure and indicates that complexation with external ligands can disrupt the association. The only volatile alkenyl barium compounds are the barium bis (cyclopentadienyl)s, but the unsubstituted parent compound is involatile at temperatures below 200° C. However, the sterically hindered bis(pentamethylcyclopentadienyl)barium, denoted $Cp^*_2Ba$, is volatile at temperatures above 140° C., and exemplifies the approach of utlizing steric hindrance to disrupt association and increase volatility, even at a higher molecular weight.

$Cp^*_2Ba$, which is clearly oxygen and water sensitive, may suitably be prepared by a modification of its known synthesis technique, to improve product yields and reproducibility of the synthesis. In this modification, $Cp^*_2Ba$ may be prepared from either the sodium or potassium salt of $Cp^*$ and anhydrous barium iodide in tetrahydrofuran (THF), with the potassium salt being found to give higher yields. THF forms a 1:1 adduct with $Cp^*_2Ba$ and must be removed prior to sublimation. Small quantities of $Cp^*_2Ba \cdot THF$ (<0.5g) can be freed of THF by gentle heating in vacuo. Although the literature reports that larger quantities of THF-free $Cp^*_2Ba$ can be prepared by reflux in toluene at reduced pressure, this procedure often results in poor yields, and can be replaced by the simpler method of slurrying the complex in toluene and then removing both the toluene and THF from $Cp^*_2Ba$ by flash distillation. Pure $Cp^*_2Ba$ then is obtained by sublimation of the THF-free crude product.

Barium dialkoxides (even with sterically hindered alcohols) are insoluble and involatile below 240° C., which is above the temperature limits of critical parts of most CVD reactor apparatus. Attempts to prepare more volatile adducts of bis (tertbutoxy) barium and tetramethylethylenediamine did not result in the isolation of a crystalline compound whose properties could be measured, and other amines may potentially usefully be employed to produce a coordinated species. Modification of the non-aqueous route devised for the acac complexes, described hereinearlier, may prove useful in such respect.

With regard to copper and yttrium source reagents, compounds potentially useful in the broad practice of the present invention include: yttrium tris (2,2,6,6-tetramethyl-3,5-heptanedionate), denoted $Y(thd)_3$; copper bis (hexafluoracetylacetonate); and copper bis (acetylacetonate). Water binds tenaciously to the yttrium complex and must be carefully removed by repeated sublimations in order to provide reproducible transport properties. Commercial copper reagents frequently contain large amounts of hydrocarbon contaminants (detectable by nmr) which are removable by sublimation, but residual water must be removed by heating the compound under vacuum for prolonged periods.

In pyrolysis studies investigating thermal decomposition pathways that occur during film growth, candidate organometallic reagent compounds were introduced with a carrier gas into a hot tube at reduced pressure, and the volatile by-products were correlated with the film prepared under similar process conditions in the film growth reactor. The decomposition of Ba source reagents was of particular interest in this respect, due to the potential for formation of $BaCO_3$ and $BaF_2$ instead of BaO.

Decomposition studies of Cu, Ba, and Y acetylacetonates (acacs) and Cu bis (hexafluoroacetylacetonate), denoted Cu(hfcac), have been carried out to evaluate the effect of two different oxidizing agents on the homogeneous decomposition mechanisms of these acetylacetonate complexes. The determinations were carried out between 250° C. and 650° C. at atmospheric pressure with a nitrogen carrier; the partial pressures of oxygen and water were 160 and 20 torr, respectively. The Ba and Y acetylacetonate complexes exhibited extremely low volatility and were introduced as solids directly into the hot zone; the copper complexes were transported into the hot zone (oven) as gases.

General trends in reactivity were observed for all of the aforementioned acetylacetonates; oxidation in oxygen resulted in the fragmentation of the acac ligand. The major products as determined by gas chromatography/mass spectrometry (GC/MS) (compound identifications were made by comparison to known mass spectra) were $CO_2$, acetone, 2-oxetanone and substituted furans. The ion chromatogram data from the decomposition of $Y(acac)_3$ showed the largest peak in the spectrum to contain $N_2$, $O_2$, and $CO_2$. The mass spectrum of the second component to be eluted from the chromatography column (minor peak) was identified as 2-oxetanone. The mass spectrum of the last major peak matched that of acetone. In contrast, the reaction of the acetylacetonate complexes with water gave 2,4-pentanedione (Hacac) as the major volatile product.

The ion chromatogram and mass spectrum data obtained for the reaction of $Ba(acac)_2$ with water at 600° showed no peak at 44 amu for $CO_2$ in the mass spectrum of the largest peak in the chromatogram, and the spectrum of the next component eluted from the column matched that of the neutral ligand. A minor peak which eluted after the 2,4-pentanedione was not identified. These results suggest that the reaction of the Cu, Ba, and Y acacs with water proceeds more cleanly than with oxygen and that water typically is a preferred MOCVD reagent giving little to no carbon incorporation.

With respect to copper source reagents potentially useful in the broad practice of the present invention, particularly in the formation of copper oxide HTSC films, $Cu(acac)_2$ and $Cu(hfacac)_2$ may advantageously be employed as source compounds. The major difference between these two Cu compounds is that copper metal forms from $Cu(acac)_2$ between 250° C. and 350° C. in water vapor; no metal formation is observed during the decomposition of $Cu(hfacac)_2$ in water. In addition, $Cu(hfacac)_2$ is more resistant to oxidation by both oxygen and water, requiring higher temperatures ($\sim 100°$ C.) for the formation of CuO.

Considering again $Ba(fod)_2$ as a barium source reagent, the pyrolysis of this compound at 650° C. and reduced pressure leads to the formation of $BaF_2$ films and a volatile liquid. The parent ligand is not observed in the GC/MS total ion chromatogram of the pyrolysis product gas. In the mass spectra of the pyrolysis product gas, the molecular ion (277 amu) of the major product corresponds to a loss of fluorine from the parent ligand but the absence of a peak at 57 amu strongly suggests that the t-butyl group is no longer intact. The molecular ion of the minor product (238 amu) corresponds to a loss of t-butyl from the parent ligand. Pyrolysis of $Ba(fod)_2$ in the presence of water leads to the same main products, although the ratio is different. In oxygen, the ratio of the two main products is inverted compared to that observed in inert gas, but in addition there is a substantial amount of low molecular weight material formed. The two main products are also observed in the pyrolysis of the neat ligand both in an inert atmosphere and in oxygen. Again, the ratio of the products is inverted under these two conditions.

In film growth process systems such as those described illustratively hereinabove with reference to FIGS. 4 and 5 hereof, maintaining exacting control of the amount of each reagent delivered to the CVD growth chamber is critical for reproducible film growth. Proper manifold and delivery system design and operation are required to achieve this control. Standard mass flow controller/bubbler configurations for atmospheric (P>20 torr) CVD operation utilize a mass flow controller upstream of the bubbler, and low pressure (P<1 torr) CVD operation utilizes the bubbler upstream of the mass flow controller. In these two configurations the entire pressure drop, from the gas cylinder (or inlet line) pressure to the growth chamber pressure, occurs across the flow control valve of the mass flow controller, allowing a known quantity of source reagent to be delivered because the saturation of the carrier gas stream occurs at a known and reproducible pressure. The carrier gas is saturated with the source reagent at the CVD growth reactor pressure in the atmospheric pressure configuration. In contrast, the carrier gas is saturated at the carrier gas cylinder pressure in the low pressure CVD arrangement, and the pressure drops from the mass flow controller outlet to the growth chamber can become significant at low pressures. In addition, the magnitude of the pressure drop is dependent on the flow rate through each bubbler.

The volatility of source reagents for the CVD of high $T_c$ superconductor materials requires that the bubblers and all downstream manifolding be heated to temperatures above 150° C. Commercially available mass flow controllers will not withstand these elevated temperatures, so it is necessary to use the standard atmospheric pressure operating configurations in which the mass flow controller is upstream of the bubbler. The result of this choice of manifold/delivery system configuration is that the saturation of the carrier gas occurs at intermediate pressures between the cylinder pressure and the deposition chamber pressure, and that the pressures inside the bubblers vary as the individual and/or total flow changes. For a known manifold design, the pressure drop can be predicted from standard fluid mechanics, and includes large nonlinear deviations at low operating pressures. This problem is overcome in the practice of the present invention by holding the manifold pressure constant with an additional argon (or other suitable gas) diluent stream which is adjusted to accommodate changes in the individual bubbler flows, with monitoring of the pressure inside each bubbler, e.g., with a baratron gauge. Small adjustments in the individual flows then are made, as determined by the pressure inside the associated bubbler, to achieve a desired partial pressure of each source reagent inside the deposition chamber.

With specific reference to the use of barium source reagent compounds in the broad practice of the present invention, the use of beta diketonate compounds such as pure barium 1,1,1,2,2,3,3-heptafluoro-7,7-dimethyl-octane-4,6-dionate typically cause so thermal decomposition of the source reagent to occur during MOCVD processing, due to the high vaporization temperature required (T>200° C.). This is an extremely undesirable situation because the vapor pressure of the barium reagent does not remain constant during the run; consequently either a high growth temperature, or a high temperature annealing following the deposition, is required to smooth out the barium concentration in the high $T_c$ superconductor layer.

In order to overcome this difficulty in applications such as the MOCVD of YBaCuO, an injection system may be employed as described in copending U.S. application No. 07/549,389 filed Jul. 6, 1990 in the names of Peter S. Kirlin, Robin L. Binder, and Robin A. Gardiner, the disclosure of which hereby is incorporated herein by reference. Instead of using a conventional bubbler, the barium reagent in the system of the copending application is dissolved in a suitable solvent, e.g., isopropanol, and injected in the hot zone immediately upstream of the reactor inlet, suitably with dispensing of the reagent solution onto a flash vaporization matrix or element disposed in the flow path to the reactor. Both the barium and the solvent are vaporized and carried into the reactor. When properly controlled, no residue is produced in the vaporization zone, even after many MOCVD runs. Temperature and flow are adjusted so that this process takes place as a single stage flash vaporization, otherwise unvaporized reagent (Ba(fod)$_2$) remains behind and its decomposition rate on the hot metal surface of the deposition substrate would vary during the growth run. For example, a vaporization zone temperature of 250° C. and an argon (carrier gas) flow of 100 cm$^3$/min may be employed to ensure that a flash vaporization is achieved. The barium concentration inside the reactor is controlled by varying the rate of addition of the solvent solution and/or the molarity of the barium in the solvent solution. This flash vaporization technique prevents the decomposition of the barium reagent, since the barium complex is at its vaporization temperature only for an instant rather than for the entire time of the deposition run, which typically is many hours in duration. Consequently, the partial pressure of barium inside the reactor remains constant. This technique, while described above with particular reference to barium delivery, is generally applicable to group II β-diketonate source reagents, and may be employed for example to deliver Sr(fod)$_2$ to the reactor in the MOCVD of BiSrCaCuO.

In the aforementioned flash vaporization delivery of the barium source reagent into the flow stream to the reactor, the use of solvents such as isopropanol function to enhance the copper deposition rate, in addition to inhibiting the deposition of barium. Isopropanol is a preferred delivery medium because of its high solubility for Ba(fod)$_2$ and its potential to decompose to give water and propene at the hot substrate surface without causing the prereaction of the yttrium and copper source reagents, such as occurs when neat water is present. Alternative Ba(fod)$_2$ delivery solvents such as methanol and tetrahydrofuran may also usefully be employed.

The MOCVD of Y$_2$O$_3$, BaO, BaF$_2$, and CuO for the formation of copper oxide HTSC films has been studied to identify mass transfer-limited growth regimes for each of the individual components of YBaCuO. Under mass transfer-limited growth conditions, the deposition rate of a given species is directly proportional to its partial pressure in the gas phase. Consequently, a linear relationship between the concentration of each component of a growing YBaCu$O_x$F$_y$ film and the partial pressure of that element in the vapor phase is expected if the MOCVD of the YBaCu$O_x$F$_y$ is carried out at conditions where the growth of the three individual components is mass transfer controlled. Operating in this mode is extremely desirable because it facilitates stoichiometric control, however, a mixture of binary oxides/fluorides, rather than YBaCuO, forms at low growth temperatures.

Using silicon as an illustrative substrate, scanning electron microscopic (SEM) examination of the three binary oxides and barium fluoride deposited on Si (100) show that with the exception of CuO extremely smooth surface topographies are achieved. Epitaxial growth is observed for BaO (a=5.52 Å), Y$_2$O$_3$ (a/2=5.30 Å) and BaF$_2$ (a=6.20 521 ) which are lattice and symmetry (cubic) matched to Si (a=5.42 Å). Mass transfer-limited growth is observed for Y$_2$O$_3$, BaF$_2$, and CuO at temperatures above 500° C. and pressures below 70 torr. The growth of BaO requires temperatures above 700° C. and partial pressures of water in excess of 20 torr. When such high partial pressures of water are used during the growth of Y$_2$O$_3$ or CuO, homogeneous nucleation nearly depletes the vapor phase of either the yttrium or copper source reagents, which makes the use of water at a concentration sufficient to give BaO infeasible during the MOCVD of YBaCuO.

In the MOCVD of $YBaCuO_xF_y$, the substrate must be appropriately prepared for the MOCVD operation. Results from the semiconductor industry indicate that the nucleation of single crystal thin films requires a clean single crystal substrate surface. When magnesium oxide is employed as a substrate material, the surface of unpretreated MgO (100) is covered with weakly bound contaminants such as physisorbed water, grease, and particulates, and chemically (or strongly) bound surface functional groups which include hydroxide (geminal and vicinal), formate and carbonate. The weakly bound contaminants, with the exception of physisorbed water, may be removed with the following procedure:

1. Rinsing in trichloroethylene with ultrasonic agitation for three minutes.
2. Rinsing in absolute ethanol for one minute.
3. Rinsing in running de-ionized water for three minutes.
4. Rinsing in methanol with ultrasonic agitation for two minutes.
5. Rinsing in running de-ionized water for two minutes.
6. Wafer is ready to be oxidized.

The use of acetone or acetonitrile must be rigorously avoided because MgO catalyzes the polymerization of these two reagents.

The physisorbed water and surface functional groups may advantageously be removed by annealing at 700° C. and $10^{-3}$ torr for one hour. During this process, surface oxygen anion vacancies are created and these are eliminated by treating the MgO (100) for 20 minutes in flowing oxygen at 700° C. and 760 torr. This sequence suitably is done inside the MOCVD reactor prior to the deposition of the oxide superconductor. If the MgO wafer is exposed to the ambient environment after annealing, then recontamination occurs by reaction of the substrate with atmospheric water, carbon monoxide, and carbon dioxide, and the high temperature pretreatment must be repeated.

In the growth of thin films of YBaCuO on MgO (100) by MOCVD using reactor systems of the type schematically shown and described hereinearlier with reference to FIGS. 4 and 5 hereof, $Y(thd)_2$, $Ba(fod)_2$, and $Cu(hfacac)_2$ may suitably be employed as source reagents at a wide range of temperatures (e.g., 500°–750° C.) and pressures (e.g., 1 to 100 torr). The as-deposited films are amorphous mixtures of oxides and barium fluoride which typically exhibit cauliflower-like morphology. In general, the morphology improves as the pressure is reduced. Increasing the temperature enhances the growth rate but gives little improvement in the morphology of the deposited thin films. MOCVD reactor pressures on the order of 2 torr and a susceptor temperature of from about 500° C. to about 600° C. are generally satisfactory to minimize the interdiffusion between the film and the substrate during growth. Randomly oriented in-situ formed superconducting thin films can be grown at temperatures exceeding 800° C., whereas growth temperatures on the order of 900° C. are typically required for c-axis films.

A suitable annealing protocol for $YBaCuO_xF_y$ thin films deposited on MgO(100) may be employed to optimize morphology by recrystallizing the film from a melt at the lowest temperature possible, and to maximize $T_c$ by tying up the Mg cation at the interface or in a nonsuperconducting scavenging phase similar to the gettering of sodium by the phosphorus in BPSG used in silicon microelectronic devices. There are several important considerations relating to such treatment:

(1) $YBa_2Cu_3O_x$ forms a low melting eutectic with CuO and $BaCuO_2$ at 890° C.;
(2) $BaCuO_2$ forms from mixtures of barium and copper oxides at 810° C. in flowing nitrogen;
(3) $YBa_2Cu_3O_7$ reacts with MgO to form a Mg-Cu-glass at the interface between the two phases; and
(4) Fluorine is rapidly removed from amorphous YBaCuOF thin films to give $YBa_2Cu_3O_x$/MgO(100) at temperatures exceeding 735° C.

Based on these observations films may be grown by MOCVD that are barium and copper rich relative to the 1-2-3 stoichiometry and the following annealing protocol may be utilized:

(1) Heat from room temperature to 835° C. in flowing Ar saturated with $H_2O$ at 15° C./min.
(2) Hold at 835° C. for 25 minutes in Ar+$H_2O$.
(3) Ar+$H_2O$ off/$O_2$ on and hold at 835° C. for 5 minutes.
(4) Heat to 910° C. in flowing $O_2$ at 15° C./min.
(5) Hold at 910° C. for 20 minutes.
(6) Cool to 500° C. in flowing $O_2$ at 3° C./min.
(7) Quench to room temperature.

A typical as-deposited film stoichiometry is 1-2.3-3.5 and since $YBa_2Cu_3O_x$ is known to begin forming at 735° C. the purpose of steps 1 and 2 is to allow all the available yttrium to react to yield the 1-2-3 phase, followed by reaction of the remaining barium oxide with copper oxide to give $BaCuO_2$, with some unreacted copper oxide remaining behind after all of the yttrium and barium have been consumed. Presumably, the low melting eutectic forms during steps 4 and 5 and the 1-2-3 phase is recrystallized from the melt during step 6. Three films whose stoichiometry varies from yttrium-rich to yttrium-poor, and which were calcined using this protocol, were studied by means of scanning electron micrographs. The yttrium-rich film (1.6-2.0-3.0), has poor morphology, and is not superconducting down to 10° K. These results are consistent with those reported by others for copper-deficient films. A film which was slightly barium- and copper-rich (1-2.3-3.5), has a resistive transition of 90° K., an onset in the inductive transition of 89° K., and exhibits a c-axis up orientation relative to MgO(100), as determined by X-ray diffraction. The morphology improved as the copper stoichiometry was increased to 5, however the superconducting properties began to decay rapidly and this particular sample was semiconducting down to 10° K.

A large number of films prepared by a variety of growth techniques have been grown on MgO, and to our knowledge the highest reported transition (R=0) is 86° K. This value is 4 degrees lower than the highest values observed using the above annealing protocol with Ba- and Cu-rich films. The degradation in $T_c$ on MgO has been widely attributed to the diffusion of the Mg cation into the superconducting thin film. Our results suggest that either the excess copper oxide or the barium cuprate acts to selectively scavenge the Mg that diffuses into the thin film. This interpretation is supported by X-ray diffraction patterns which exhibit a broad peak centered about $2\theta$ of 18° which indicates the formation of a weakly crystalline or glassy phase such as a Mg-Cu glass.

A tremendous amount of effort has been directed at the thin film growth of high $T_c$ superconductors in recent years. Efforts have specifically been focused on achieving good superconducting properties at low process temperatures which are compatible with standard Si device processing technology, and which virtually eliminate interdiffusion between the oxide thin film and the substrate. To this end we have discovered a low temperature annealing protocol for amorphous YBaCuO$_x$F$_y$ films. The key to this low temperature process is the presence of BaF$_2$ rather than BaCO$_3$ in the as-deposited film. The latter compound (BaCO$_3$) requires temperatures in excess of 950° C. to decompose, whereas the former (BaF$_2$) can be reacted with H$_2$O to give BaO and HF. The HF can be removed in a flowing system, to drive the reaction to completion. The efficacy of this process over a 30 minute time frame was investigated. The results of this investigation showed that fluorine remained behind in the films maintained at or below 725° C. Contrariwise, no fluorine was detected in the films treated at or above 735° C. with an argon stream saturated with 20 torr of H$_2$O. Horowitz et al. ("Sub-micrometer, Superconducting YBa$_2$Cu$_3$O$_{6+x}$ by a Low Temperature Synthetic Route," Science, 243, 666 (1989)) have reported that heating an intimate micromixture of the binary oxides in an inert atmosphere at temperatures between 650° C. and 700° C. gives YBa$_2$Cu$_3$O$_6$ which can be further oxidized to the orthorhombic phase in O$_2$ at temperatures above 400° C. Based on these results the following calcination protocol was developed:

(1) Heat from room temperature to 735° C. in flowing Ar saturated with H$_2$O at 15° C./min.
(2) Hold at 735° C. for 30 minutes in Ar+H$_2$O.
(3) H$_2$O off and cool to 700° C. at 15° C./min.
(4) Hold at 700° C. for 4.5 hours in Ar.
(5) Ar off/O$_2$ on and cool to 500° C. in flowing O$_2$ at 3° C./min.
(6) Hold at 500° C. for 12 hours in O$_2$.
(7) Quench to room temperature.

Scanning electron micrographs of 1-2-3 samples calcined using the above protocol show an open granular morphology. In contrast to the standard annealing protocol, no enhancement in T$_c$ was expected and none was observed for samples rich in Ba and/or Cu. The oxygen soak in step 6 was attempted at lower temperatures and this had a detrimental effect on T$_c$. Resistive transitions of YBaCuO$_x$F$_y$/MgO(100) samples calcined with this method typically are in the range of between 80° K. and 85° K.

The features and advantages of the invention are more fully shown hereinafter by the ensuing non-limiting examples. In all examples, the synthesis and handling of all organometallics was performed under nitrogen atmosphere using standard Schlenk techniques or i a Vacuum Atmospheres inert atmosphere glove box.

Quantitative gas analyses were performed using a Perkin Elmer Sigma 2000 gas chromatograph equipped with a 45m SE-30 0.5 mm capillary column and a flame ionization detector. A Hewlett Packard 5890 gas chromatograph equipped with a 60m SE-30 0.5 mm capillary column and a HP5970 quadrapole mass spectrometer was used for peak identification.

Nuclear magnetic resonance spectra were obtained on an IBM WP200SY spectrometer. $^1$H chemical shifts are reported in ppm on a δ scale with tetramethylsilane or residual proton resonances from the nmr solvents serving as internal standards.

All synthetic procedures were performed using standard inert atmosphere techniques. Cryogenic nitrogen was purified using Ridox ® and molecular sieves. Toluene was refluxed over sodium benzophenone ketyl and distilled prior to use. Tetrahydrofuran (THF) was refluxed over purple sodium benzophenone ketyl and distilled prior to use.

Low pressure flow pyrolyses were performed with volatiles being trapped at liquid nitrogen temperature upon egress from the pyrolysis chamber. At the conclusion of the pyrolysis experiment, gas phase samples were withdrawn by syringe for analysis by gas chromatography and gas chromatography/mass spectrometry. The non-volatile pyrolysate was then dissolved in pentane and subjected to analysis by gas chromatography and gas chromatography/mass spectrometry.

EXAMPLE I

Preparation of barium bis(2,2,6,6-tetramethyl-3, 5-heptanedione) and tetraglyme adduct Barium bis (2,2,6,6-tetramethyl-3, 5-heptanedione was synthesized by the procedure of (H(thd)) (9.2 g,0.05 moles) was added dropwise with stirring. Stirring was continued for 24 hours and a white solid precipitated. The solid was filtered and washed with cold water (to remove any unreacted barium hydroxide) and then with cold pentane (to remove any unreacted H(thd)), following which it was dried by a N$_2$ purge and weighed (9.01 g, 72%). Trace organic impurities were removed by vacuum sublimation in an apparatus designed to purify relatively involatile organometallic compounds. 3.86 g of the crude product was purified by sublimation (230° C., 0.05 mmHg) to give a pale yellow solid (2.7 g, 70%) with melting point of 168°–170° C. $^1$H nmr peaks were observed (C$_6$D$_6$)∂1.24 (s, 18H), 5.93 (1H) ppm. [See "Gas chromatographic and related properties of the alkaline earth chelates with 2,2,6,6-tetramethyl-3,5-heptanedione," Scharberg, J. E.; Sievers, R. E.; Moshier, R. W. Anal. Chem.. 1970, 42, 1828. ]

EXAMPLE II

Preparation of barium bis (2,2,6,6-tetramethyl-3,5-heptanedionate).(tetraglyme) adduct H(thd) (2.65 g, 0.014 moles) was added to a stirring suspension of barium hydride (1.0 g,0.007 moles) in about 20 ml of tetraglyme. Gas evolution began immediately as the β-diketone was added. The reaction mixture was stirred overnight to yield a cream colored solid and a pale yellow solution. The solid was filtered and washed with cold pentane (some solid dissolved). The product was weighed in an inert atmosphere (1.04 g, 27%) and sublimation attempted at 50μ. At about 90° C. a colorless liquid was observed condensing on the cold finger of the sublimator, leaving a cream colored solid. No solid sublimed up to a temperature of 200° C. A further 0.8 g (20%) of solid precipitated from the reaction solution on standing. Ba(thd)$_2$ (1.0 g, 0.0019 moles) was dissolved in 20 ml of tetraglyme. The solution was then cooled to 0° C. for 48 hrs. No solid precipitated out of the solution.

EXAMPLE III

Preparation of barium 1,1,5,5,5-hexafluoro-2, 4-pentanedionate)

1,1,1,5,5,5-Hexafluoro-2,4-pentanedione (14.74 g, 0.07 moles) was added to a stirred suspension of barium hydride (11.36 g, 0.035 moles) in tetraglyme. Immediate evolution of gas was observed continuing throughout the addition of the B-diketone. The resulting, yellow solution was decanted from a white solid (11.3 g, 42%). The solid was washed with about 50 ml of cold pentane and dried at 100° C. (200μ) yielding a white solid (10.9 g, 40%). The yellow solution was cooled to 0° C. but no precipitate had formed after 48 hrs.

EXAMPLE IV

Preparation of barium bis (1,1,1,5,5,5-hexafluoro-2.4-pentanedionate).tetraglyme Tetraglyme (0.4 g, 0.002 moles) was added to a suspension of barium bis (1,1,1,5,5,5-hexafluoro-2,4-pentanedionate) (1.0 g, 0.0018 moles) in toluene. The resulting suspension was stirred overnight. The toluene was removed at reduced pressure to leave a white, gelatinous solid which was washed with about 20 ml of cold pentane to leave a white solid (0.96 g, 62%).

EXAMPLE V

Preparation of barium bis (1,1,1,2,2,3,3-heptafluoro-7,7-dimethyl-4,6-octanedionate)

Fod-H (4.0 g, 0.014 moles) was added to 25 ml of freshly distilled tetrahydrofuran (thf). The fod-thf solution was added dropwise to a refluxing suspension of barium hydride (1.0 g, 0.07 moles) in 25 ml of freshly distilled thf. The mixture was refluxed for 24 hrs. and became clear and pale yellow. The thf was removed at reduced pressure to leave a cream colored solid (4.6 g, 96%) with a melting point of 188°–191° C.

EXAMPLE VI

Preparation of barium bis (2,2-dimethyl-6,6,7,7,8,8,8-heptafluoro-3,5-octanedionate).(tetraglyme) adduct Ba(fod)$_2$ (0.07 g, 0.001 moles) was dissolved in 20 ml of toluene. To this solution was added tetraglyme (0.21 g, 0.0009 moles). The resulting solution was cooled to −78° C. No precipitation occurred after 48 hrs. The toluene was removed by a N$_2$ purge to leave a brown waxy solid. This solid was heated in a sealed glass tube at 1000μ.

EXAMPLE VII

Preparation of barium bis(pentamethyl cyclopentadienyl).tetrahydrofuran adduct

Barium bis (pentamethyl cyclopentadienyl) was synthesized by the method described in "Solution synthesis of calcium, strontium, and barium metallocenes," M. J. McCormick, et al., *Polyhedron,* Vol. 7, pp. 725–730 (1988).

EXAMPLE VIII

Preparation of barium bis (acetylacetone).(tetraglyme) adduct

Ba(acac)$_2$ (1.0 g, 0.0029 moles) was added to about 50 ml of tetraglyme. The suspension was stirred overnight and filtered. The white solid was analyzed by $^1$H nmr, but gave no signals in d6-benzene or d6-acetone. 100 ml of pentane was then added to about 5 ml of the pale yellow filtrate, whereupon a cream-colored solid precipitated. The precipitate was washed with about 50 ml of pentane. A small amount of the washed precipitate was then heated in a sealed glass tube at 200μ. Ba(acac)$_2$ (4.0 g, 0.011 moles) was added to a solution of tetraglyme (2.69 g, 0.012 moles) in ~25 ml of toluene. The toluene was then removed by a nitrogen purge to give a white solid. $^1$H nmr in d6-acetone showed peaks associated with tetraglyme only.

EXAMPLE IX

Preparation of barium bis (1,1,1-trifluoro-2,4-pentanedionate).(tetraglyme) adduct H(tfacac) (5.0 g, 32.4 mmoles) was added dropwise via syringe to a stirred slurry of barium hydride (2.26 g, 16.1 mmoles) in tetraglyme. Immediate gas evolution was observed which continued throughout the addition of the β-diketone. The reaction mixture was stirred overnight. The resulting mixture was filtered to leave a white solid and an orange filtrate (crystals formed in the filtrate). The solid was washed with cold pentane and then dried by a nitrogen purge (4.2 g, 6.3 mmoles, 40%). 0.95 g of the crude material was then sublimed at 150° C., 100μ to yield 0.60 g, 25%, which was then resublimed.

EXAMPLE X

Preparation of calcium bis (2,2-dimethyl-6,6,7,7,8,8,8-heptafluoro-3,5-octanedionate)

Calcium bis (2,2-dimethyl-6,6,7,7,8,8,8-heptafluoro-3,5-octanedionate) was synthesized by the method described in "Volatile alkaline earth chelates of fluorinated alkanoylpivalymethanes", R. Belcher et al, *Analytica Chimica Acta,* 60, (1972) p. 109–116.

EXAMPLE XI

Preparation of strontium bis (2,2-dimethyl-6,6,7,7,8,8,8-heptafluoro-3,5-octanedionate)

Strontium bis (2,2-dimethyl-6,6,7,7,8,8,8-heptafluoro-3, 5-octanedionate) was synthesized by the method described in "Volatile alkaline earth chelates of fluorinated alkanoylpivalymethanes," R. Belcher et al., *Analytica Chimica Acta,* 60, (1972) p. 109–116.

EXAMPLE XII

MOCVD of YBaCuO on MgO (100) using barium bis (hexafluoroacetylacetonate).(tetraglyme) adduct as barium source reagent MOCVD of the oxide thin films was performed with a reactor system specifically designed for the growth of complex multicomponent oxide thin films, of the general type schematically represented in FIG. 4 hereof. Independent temperature control of each element source reagent bubbler, the mixing manifold, and the organometallic injection system was used. The temperature of the SiC susceptor was maintained with an infrared lamp, and a horizontal tubular reactor configuration was utilized. The susceptor was fabricated with its substrate element support face having an angle of inclination of 11° relative to the gross direction of gas flow, in order to maintain a uniform boundary layer thickness along the length of the deposition zone.

Maintaining exacting control of the amount of each reagent delivered to the growth chamber was accomplished by (1) holding the manifold pressure constant with an additional argon diluent stream (line 3 in FIG. 4) which was adjusted to accommodate changes in the individual bubbler flows, and (2) monitoring the pressure inside each bubbler with a baratron gauge. Small adjustments in the individual flows were made as determined by the pressure inside the associated bubbler, to achieve the desired partial pressure of each source reagent inside the deposition chamber. No decomposition in the bubblers of the Group II source reagents was observed even after several growth runs.

Barium bis (hexafluoroacetylacetonate).(tetraglyme) adduct, yttrium tris (2,2,6,6-tetramethyl-3,5-heptanedionate), and copper bis (hexafluoroacetylacetonate) were used as the metalorganic source reagents. The MOCVD of YBaCuOF on MgO(100) was carried out at 500° C. and 1.5 torr with an oxygen:argon mole ratio of 1:2, chosen to minimize carbon contamination in the as-deposited films. Deposition parameters were adjusted to give the 1-2-3 composition on each substrate, with the temperature and carrier flow rate being set out in Table VII below for each of the source reagent species.

TABLE VII

| Ba Carrier (cm³/min) | Ba Bubbler Temp. (°C.) | Y Carrier (cm³/min) | Y Bubbler Temp. (°C.) | Cu Carrier (cm³/min) | Cu Bubbler Temp. (°C.) |
|---|---|---|---|---|---|
| 50 | 158 | 9.5 | 140 | 42.1 | 4 |

The stoichiometries of films grown on MgO (100) and Si (100) wafers placed side by side on the susceptor were indistinguishable as determined by atomic absorption analysis. Typical growth rates achieved under these conditions were 0.5 to 1 microns/hour. The as-deposited films were amorphous mixtures of the oxides/fluorides and exhibited cauliflower-like morphology which is indicative of low surface mobility growth.

The following annealing protocol was utilized to convert the amorphous YBaCuOF films deposited on the MgO(100) substrates, to superconducting thin films:

(1) Heating from room temperature to 835° C. in flowing argon saturated with water at 15° C./min.
(2) Holding the film at 835° C. for 25 minutes in a gas mixture of argon and oxygen.
(3) Turning the flow of argon and oxygen gas mixture off and flowing oxygen past the film while holding the film at 835° C. for 5 minutes.
(4) Heating to 910° C. in flowing oxygen at 15° C./min.
(5) Holding at 910° C. for 20 minutes.
(6) Cooling to 500° C. in flowing oxygen at a rate of 3° C./min.
(7) Quenching the film to room temperature.

The films were x-axis oriented as determined by X-ray diffraction. The highest transition temperature, 90° K., was observed for films which were slightly barium- and copper-rich, that is, with an approximate stoichiometry for Y:Ba:Cu of 1:2.3:3.5.

EXAMPLE XIII

MOCVD of YBaCuO on MgO (100) using barium bis (trifluoroacetylacetonate).(tetraglyme) adduct as barium source reagent The procedure of Example XIII was repeated, but with barium bis (trifluoroacetylacetonate).(tetraglyme) adduct as the barium source reagent and at the growth conditions set out in Table VIII below. The results obtained were indistinguishable from those described in Example XIII.

TABLE VIII

| Ba Carrier (cm³/min) | Ba Bubbler Temp. (°C.) | Y Carrier (cm³/min) | Y Bubbler Temp. (°C.) | Cu Carrier (cm³/min) | Cu Bubbler Temp. (°C.) |
|---|---|---|---|---|---|
| 50 | 178 | 9.5 | 140 | 42.1 | 44 |

EXAMPLE XIV

MOCVD of Oriented BiSrCaCuO Thin Films on (100) MgO

Calcium and strontium 1,1,1,2,2,3,3-heptafluoro-7,7-dimethyloctane-4,6-dionate, triphenylbismuth, and copper hexafluoroacetylacetonate were used as source reagents in the MOCVD of BiSrCaCuOF. The reagents were purified by recrystallization followed by repeated sublimation; the efficacy of the purification protocols was verified by gas chromatography/mass spectroscopy, atomic absorption analysis, and inductively coupled plasma emission spectroscopy. The MOCVD system was the same as in the previous examples, operated in this case at 2 torr. The susceptor (7.7 cm diameter) was resistively heated to 500° C. and the reactor chamber walls were maintained at 200° C. to prevent the condensation of unreacted source reagents. Great care was taken to maintain the manifold temperature to ensure reliable transport of the reagents. The deposition was carried out on (100) oriented MgO single crystal substrates. Prior to growth the wafers were degreased in trichloromethane, ethanol, and methanol, followed by rinsing in deionized water. The MgO substrates were mounted on a high purity boron nitride mask. Growth conditions are set out in Table IX below.

TABLE IX

| O₂ flow rate (cm³/min) | Ar flow rate (cm³/min) | Source Reagent Transport Rate ($10^{-6}$ mole/min) | | | |
|---|---|---|---|---|---|
| | | Ph₃Bi | Sr(fod)₂ | Ca(fod)₂ | Cu (hfacac)₂ |
| 70 | 200 | 20–30 | 4–12 | 4–12 | 2–4 |

The superconducting phases were formed with a two-step annealing protocol. Fluorine was removed from the film during the first step, which consisted of a 30° C./min temperature elevation ramp, followed by 30–60 minutes at 750° C. in wet oxygen. The second step (carried out at a temperature of 850°–870° C.) promoted the formation of the high $T_c$ phase by partially melting the film for a short period followed by rapid cooling. X-ray diffraction analysis showed that the films were predominately $Bi_2Sr_2CaCu_2O_7$. Onset of the resistive transition was at 110° K. and zero resistivity ($R \leq 10^{-4} \mu\Omega$–cm) was observed at 83° K.

EXAMPLE XV

MOCVD of TlBaCaCuO

Precursor films were prepared by MOCVD at 500° C. and 4 torr in an inverted vertical reactor. Barium and calcium 1,1,1,2,2,3,3-heptafluoro-7,7-dimethyl-octane-4,6-dionate and copper hexafluoroacetylacetonate were used as the source reagents and typical run conditions are listed in Table X below. Nominal growth rates of 0.2 microns/hr were realized on degreased MgO(100) single crystal substrates. The cation ratio of the precursor films was predetermined by atomic absorption analysis.

TABLE X

| Deposition conditions for BaCaCuOF films Source Reagent transport rate | | | | |
|---|---|---|---|---|
| $O_2$ flow rate | Ar flow rate | \multicolumn{3}{c}{$(10^{-6}$ mole/m)} | | |
| (sccm) | (sccm) | $Ba(fod)_2$ | $Ca(fod)_2$ | $Cu(fod)_2$ |
| 170 | 190–210 | 12–18 | 6–15 | 0.35–0.56 |

The deposited films were an amorphous mixture of oxides and fluorides and were found to be highly stable in air. No change in the properties of the precursor films was observed after ambient storage of the films for several weeks before proceeding to the annealing step. The films were annealed for 45 minutes at 785° C. in wet oxygen to remove fluorine. The absence of fluorine in the annealed films was confirmed by EDX analysis. Thallium was incorporated in a second annealing step at 870° C. for 10 min. Pellets of ground $Tl_2O_3$ and $BaCaCuO_x$ (molar ratio of 2:2:2:3) were used as the source of $Tl_xO_y$ vapor. The films were loaded in a capped $Al_2C_3$ boat, sandwiched between the pellets with the film facing down. This configuration was crucial to reproducibly obtaining complete thallium uptake during the second annealing step.

The color of the as-deposited, yellow films changed to brown after fluorine removal, and finally to dark gray after thallium incorporation. The post-annealed films had a glossy metallic appearance. Typical surface morphologies consisted of rod-shaped crystallites dispersed within a matrix of smooth continuous platelets. The average platelet diameter was approximately 5 microns and a small number of voids were evident. EDX analysis indicated that the platelets were calcium-rich relative to the rod-shaped crystallites. The cation ratio is Tl:Ba:Ca:Cu=2.0:1.9:1.4:2.0 as determined by Rutherford backscattering spectroscopy (RBS). The X-ray diffraction analysis indicates that the films were predominantly the 2212 phase with the c-axis oriented perpendicular to the surface of the MgO. A few small peaks which do not belong to the (001) series and are indicative of impurity phases were also present. Increasing the maximum annealing temperature to 875° C. increased the platelet dimensions to several tens of microns. In addition, more pronounced resistivity drops between 120° and 125° K. were observed, which suggests that the impurity phases are the 2223 and/or 1223 superconductors. These results are consistent with indications that annealing sputter-deposited TlBaCaCuO films for prolonged periods at high temperatures (e.g., 900° C. for 1 hour) gives films with sheet-type morphologies and large fractions of the highest Tc (2223) phase.

The resistivity of the resultant films was measured as a function of temperature using a standard four-point probe method. Electrical contact to the films was made by indium soldering copper wires to sputtered silver contact pads (1 mm²). The films were annealed at 500° C. for 10 minutes to minimize the specific contact resistance of the silver pads. When resistivity of the film was plotted as a function of temperature, the resistivity deviated from a monotonic decline at 125° K. and reached zero at 108° K. The breadth of the corresponding inductive transition suggested that the film was weakly linked and/or contained a distribution of phases with differing $T_c$'s; either effect may be caused by the slight excess of calcium present in the films. Calcium-and/or copper-rich (relative to 2212) films annealed with this protocol ($T_{max}=870°$ C.) showed a sharp drop in resistivity between 120° and 125° K., with the transition being complete by 105°±3° K. The resistive transitions of two 0.4 micron thick films with dramatically different precursor stoichiometries were forced to be almost identical. This indicates that the formation of the 2212 phase was fairly tolerant of the precursor cation ratio and that the present approach for TlBaCaCuO film fabrication is promising for mass production. Critical current (Jc) values as large as $10^4$ Amps/cm² (1 μV criterion) were reached are much higher at lower temperatures.

In summary, high quality $Tl_2Ba_2CaCu_2O_x$ thin films were fabricated on MgO (100) single crystal substrates by a three-step process. MOCVD of BaCaCuOF was carried out at 500° C. and 4 Torr using fluorinated β-diketonate complexes of Ba, Ca, and Cu. Fluorine was stripped in wet oxygen at 785° C. and c-axis oriented $Tl_2Ba_2CaCu_2O_x$ films then were formed by annealing in dry oxygen at 870° C. in the presence of $Tl_2O_3/Ba_2Ca_2Cu_3O_x$ pellets. The best films showed onsets of superconductivity at 125° K. and zero resistivity was reached by 108° K. Critical current densities as high as $10^4$ Amps/cm² were obtained at 90° K.

EXAMPLE XVI

MOCVD of $BaF_2$

Thin $BaF_2$ films were grown in a MOCVD reactor of the type schematically shown in FIG. 5, with a heated manifold and injection zone which allowed uniform thin films to be grown from relatively involatile but chemically reactive source reagents.

The barium source reagent employed was $Ba(fod)_2$, which was synthesized in accordance with the procedure of Example V herein. Trace organic impurities were removed by vacuum sublimation, and efficacy of the purification procedure was verified by inductively coupled plasma atomic emission spectroscopy, which detected trace metal impurities, and gas chromatography/mass spectrometry (trace organic impurities).

Silica ($SiO_2$) was employed as a substrate material because of the good lattice match between the pseudo-lattice constant of quartz (a=5.4 Å) and the barium fluoride film (a=6.20 Å). Both $BaF_2(T_m=1355°$ C.) and $SiO_2(T_m=1665°$ C.) have extremely high melting points, and thus reaction interdiffusion during deposition is minimized.

Thin films of barium difluoride approaching epitaxial quality were deposited by MOCVD, with the best morphologies being achieved at low pressures.

EXAMPLE XVII

MOCVD of $BaTiO_3$

A solution of barium bis (2,2,6,6-tetramethyl-3,5-heptane-dione), at a concentration of 0.6 g Ba/100 cc solution, is pumped onto a metallic surface that comprises a flash vaporization zone for the barium source compound. The temperature of this vaporization surface is measured with a thermocouple, and held at 220° C. This region is in the Ti manifold, where $Ti(OP)_4$ is carried by dry argon gas at 100 sccm. The molar fraction of Ti in this gas is controlled by using a throttle valve in the manifold to adjust the total pressure at the $Ti(OP)_4$ bubbler. The bubbler is held at 50° C. The Ti manifold is maintained at 100° C. to prevent condensation of the Ti reagent.

The Ba and Ti carrier gas mixture enters the vertically oriented reactor at the bottom. At this point oxygen is also entering the reactor, at 100 sccm. Total pressure at the substrate is approximately 1.0 torr. The relative partial pressure of Ti and Ba at the substrate are controlled by varying the pumping rate of the barium source compound solution and the total pressure at the Ti(OP$_4$) bubbler.

Si [100] and SrTiO$_3$ [100] substrates are used for film growth. The substrate temperature is 850° C. It is heated by contact with a SiC susceptor, which is inductively heated by a 400 KHz EMF, originating in coils outside the reactor. Film growth duration is typically 1 hour; reactor evacuation, purge sequences, heat-up and cool-down make the entire growth process last about 3 hours.

The films are characterized by SEM/EDS and XRD. The former is used to determine growth morphology and approximate stoichiometry. The latter is used to determine crystalline phases present, including their orientation. In both cases, a-axis oriented BaTiO$_3$ is formed.

Alternatively, films of BaTiO$_3$ can be formed by MOVCD using Ba(fod)$_2$ as the barium source reagent, delivered in an isopropranol solution. Growth conditions are set out in Table XI below.

TABLE XI

| O$_2$ flow rate (cm$^3$/min) | Ar flow rate (cm$^3$/min) | Source Reagent Transport Rate 10$^{-6}$ mole/min | |
|---|---|---|---|
| | | Ti(Oi-Pr)$_4$ | Ba(fod)$_2$ |
| 70 | 200 | 20–30 | 4–12 |

EXAMPLE XVIII

Copper bis (1,1,1,5,5,5-hexafluoro-2, 4-pentanedionate)

Copper bis (1,1,1,5,5,5-hexafluoro-2,4-pentanedionate was synthesized by the method described in "A study of bis (hexafluoroacetylacetonate) copper (II)" J. A. Bertrand, et al., Inorganic Chemistry, Vol. 3, pp. 489–491 (1966).

EXAMPLE XIX

Purification of copper bis (pentane-2,4-dionate)

Copper acetylacetonate (10 g) was heated in a sublimator to 433° K. for 3 hours. Sublimation started to occur at approximately 390° K. The sublimate was then weighed in an inert atmosphere whilst the trap residue was analyzed by GC/MS. The method was then repeated with the sublimate. GC/MS showed the presence of acetylacetone in the trap. No difference in color was observed between the hydrated and dehydrated forms.

TABLE XII

| Starting mat. | Mass | Sub. Temp. | % sublimed |
|---|---|---|---|
| Cu(acac)$_2$ | 10.0 g | 120–160 | 75 |
| Sublimate 1 | 7.2 g | 160 | 96 |

EXAMPLE XX

Preparation of yttrium tris (2,2,6,6-tetramethylheptane-3,5-dionate)

2,2,6,6-Tetramethylheptane 3,5-dione (64.9 g, 0.353 moles) was added to 175 ml of degassed 95% ethanol. To this was added a degassed solution of sodium hydroxide (14.1 g, 0.353 moles) in 150 ml of 95% ethanol and 140 ml distilled water. This produced a clear yellow solution. 42.9 g (0.118 moles) of yttrium nitrate was dissolved in 150 ml of 95% ethanol and 140 ml of distilled water and the solution degassed. This was then transferred to a 3 liter flask fitted with a mechanical stirrer. The solution containing the thd ligand was then added to yttrium solution over a period of 3 hours, with continuous stirring. The reaction mixture was stirred for a further 24 hours and then 1800 ml of distilled, degassed water was transferred to the reaction flask which caused a pale yellow precipitate to form. This was filtered in air and washed with approximately 300 ml of degassed water. The solid was then transferred to a 500 ml flask where it was dried at 373° K. under reduced pressure for 4 hrs. The resulting pale yellow solid was weighed in an inert atmosphere. The crude material was sublimed (150° C., 50 $\mu$m) to yield pure yttrium (thd)$_3$ (150 g, 95%). $^1$H nmr (C$_6$D$_6$), $\delta$1.19(s, 9H), 5.97 (s, 1H)ppm.

EXAMPLE XXI

Preparation of barium bis (1,1,1,5,5,5-hexafluoro-2, 4-pentanedionate) 2,2'-bipyridine adduct Barium 1,1,1,5,5,5-hexafluoro-2,4-pentanedionate (0.2 g, 0.0363 mmole) was weighed out under nitrogen in a serum vial. The vial was capped and 2,2'-bipyridine (0.0586 g, 0.0375 mmole) in methanol was added via cannula. The vial and its contents were shaken vigorously. The methanol was removed by flushing the vial with nitrogen to leave a white solid. The vial was then heated under a flow of nitrogen at 66° C. for one hour. The solid was collected and the melting point was determined (180°–184° C.).

EXAMPLE XXII

Preparation of barium bis (1,1,1,2,2,3,3-heptafluoro-7, 7-dimethyl-4,6-octanedionate) 2,2'-bipyridine adduct Barium hydroxide (4.6 g, 14.6 mmoles) was added to a mixture of 2,2'-bipyridine (5.0 g, 29.2 mmoles) in water (50 ml) and ethanol (50 ml) and the mixture was allowed to stir until the barium hydroxide dissolved. Hfod (4.31 g, 14.61 mmoles) was added dropwise with stirring and stirring was continued for 40 hours. An oily solid was formed, and the excess water and ethanol was removed and water (100 ml) was added. The mixture was stirred at 50° C. to remove the excess ethanol from the solid. The solid changed in consistency to a light beige powder and the water was removed. The washing process was repeated and the solid was isolated by filtration. The isolated solid was dissolved in ether and filtered to remove any unreacted barium hydroxide. Ether was evaporated to leave a light brown solid which melted at 102°–107° C. and sublimed completely at 145° C. (50 $\mu$m). The sublimed material could be melted and resublimed. The presence of barium in the compound and the sublimate was confirmed by observing a white precipitate upon addition of the compound or the sublimate to dilute sulfuric acid. $^1$H nmr of the compound shows the presence of barium bound 2,2'-bipyridine, sometimes hereinafter denoted "bipy", and 1,1,1,2,2,3,3-heptafluoro-7,7-dimethyl-4,6-octanedionate, as evidenced by the shift in the resonance of the protons adjacent to the coordinated nitrogen and attached to the central atom of the acetylacetonate. The ratio of bipy:fod:Ba was approximately 4:2:1 as determined by integrated peak intensities.

EXAMPLE XXIII

Preparation of Bisacetylacetone-ethylenediimine

Acetylacetone (5.0 g, 0.05 moles) was added to 50 ml of 100% ethanol, which had been dried over 3A molecular sieves. This was degassed and added to a degassed solution of 1.5 g (0.025 moles) of ethylenediamine in 10 ml of 100% ethanol. The mixture, which had changed from colorless to yellow, was then refluxed for 1 hour and diluted with 150 ml of deionized water. The reaction flask was next cooled to $-273°$ K. in an ice bath causing fine strands of solid to be precipitated. The solution was then filtered and the solid was washed with approximately 200 ml of cold water. The solid then recrystallized from 100% ethanol. The resulting yellow/white solid was heated to 351° K. under reduced pressure to remove solvent, and weighed in an inert atmosphere yielding bis(acetylacetone)ethylenediimine (2.3 g, 45%). m.p. 102°–106° C. $^1$H nmr ($C_6D_6$) $\delta$1.18 (br. s.2H), 1.36 (s,3H), 1.97 (s,3H), 2.37 (d,4H), 4.80 (s 1H), 10.98 (br. s.1H) ppm.

EXAMPLE XXIV

Preparation of Bis(acetylacetone)propylene-1, 3-diimine [H2(propAA2)]

Acetylacetone (5.0 g, 0.05 moles) was added to approximately 50 ml of 100% ethanol, which had been dried over 3A molecular sieves. This solution was heated to 250° K. and to it a solution of 1,3-diaminopropane (1.85 g, 0.0025 moles) in approximately 10 ml of 100% ethanol were added. The mixture was refluxed for 2 hours, following which approximately 200 ml of distilled water was added to the then yellow solution. The reaction flask was next then cooled to 273° K. in an ice bath to initiate precipitation of the product. No precipitation occurred, so the ethanol and water were removed at reduced pressure and 373° K., leaving a cream colored solid and an orange liquid. This liquid cooled to form an orange/white solid (3.53 g, 59%) of crude [H2(propAA2)], m.p. 308°–313° K. The solid could be purified by sublimation (90° C., 50 μm). $^1$H nmr $C_6D_6$) $\delta$0.96 m,2H), 1.34 (2,1H), 1.38 (s,3H), 2.03 (s,3H), 4.84 (s,1H), 11.06 (br. s,1H)ppm.

EXAMPLE XXV

Preparation of Bis (2,2-dimethyl-6,6,7,7,8,8,8-heptafluoro-3,5-octanedione) ethylenediimine [H2(enHPM2)]

Hfod (4.8 g) was added to approximately 100 ml of THF (dried over 3A molecular sieves) and the solution cooled to 213° K. in a dry ice/isopropanol bath. To this solution, over a period of 2 hours, was added a solution of 0.5 g of ethylenediamine in approximately 50 ml of THF. As the amine was added, the temperature of the reactants rose to room temperature. (A white solid was produced, but this was probably due to the reaction between a 'spray' of the amine and any β-diketone in the gas phase.) The solution was then reduced to approximately 25 ml and diluted with approximately 150 ml of degassed water causing a white precipitate to be formed. This was purified by sublimation (3.6 g 74%) at 313°–323° K. $^1$H nmr ($C_6D_6$), $\delta$0.97 (2, 9H), 2.41 (s, 4H), 5.95 (s,1H) ppm.

EXAMPLE XXVI

Preparation of Bis (2,2-dimethyl-6,6,7,7,8,8,8-heptafluoro-3,5-octanedione)propylene-1, 3-diimine [H2(propHPM2)]

2,2-Dimethyl-6,6,7,7,8,8,8-heptafluoro-3,5-octanedione (4.8 g) was dissolved in approximately 50 ml of THF (dried over 3A molecular sieve) and the solution cooled to 273° K. in an ice bath. To this solution over a period of 2 hours was added 0.6 g (0.008 moles) of 1,3-diamineopropane in approximately 20 ml of THF. White fumes formed (cf. H2(enHPM2) preparation). The solution was stirred for 2 additional hours then reduced to approximately 25 ml. The addition of approximately 150 ml of degassed water caused the precipitation of a white solid which was weighed in an inert atmosphere to give 3.6 g (72% yield) of a white solid m.p. 383°–386° K. Sublimation at 363° K. (30–50 microns) gave 3.3 g (66% yield) of white solid m.p. 383°–386° K. $^1$H nmr (DMSO-d6) $\delta$0.93 (s,9H), 1.16 (m,2H), 2.78 (m,4H), 5.36 (s,1H) ppm.

EXAMPLE XXVII

MOCVD of $BaF_2/CaF_2$

An isopropanol solution of Ba(fod)2 and Ca(fod)2 was made up, containing 4 percent by weight of the barium reagent and 4 percent by weight of the calcium reagent, based on the weight of solvent in the solution. The resulting barium/calcium reagent solution was employed at ambient temperature (approximately 25° C.) and injected into the first fluid flow passage of a delivery system of the type which is schematically shown and described with reference to FIG. 1 of prior copending U.S. application Ser. No. 07/549,389 filed Jul. 6, 1990, the disclosure of which hereby is incorporated herein by reference.

The barium reagent, calcium reagent, and isopropanol were vaporized and carried into the reactor to form a layer of barium fluoride/calcium fluoride ($BaF_2/CaF_2$) on a silicon substrate. The vaporization zone temperature in the delivery system was maintained at approximately 250° C. The carrier gas was argon, at a flow rate of 100 cubic centimeters per minute ($cm^3$/min.). These conditions ensured that flash vaporization was achieved.

The barium and calcium concentrations inside the deposition reactor were controlled by varying the rate of the addition of the isopropanol reagent solution and/or the molarity of the reagent solution. These flash vaporization techniques prevented the premature decomposition of the barium and calcium reagents, since the related complexes were at their vaporization temperatures only for a brief instant rather than for the entire time period of the deposition run, which was on the order of 4 hours. As a consequence, the partial pressure of the Group II reagents inside the reactor remained constant, and the barium fluoride/calcium fluoride stoichiometry and delivery were closely controllable to provide a desired layer thereof on the substrate.

EXAMPLE XXVIII

MOCVD of $SrF_2/CaF_2$ Films

Using a reagent delivery system of the type shown in FIG. 1 of prior copending U.S. application Ser. No. 07/549,389 filed Jul. 6, 1990, $SrF_2/CaF_2$ films were deposited on Si(100) at a substrate temperature of 500° C. and reactor pressure of 1 torr. MOCVD was carried out with an oxygen-to-argon ratio of 1; however, no carbon was observed by EDS (sensitivity ca. 1%) at ratios ranging from 0.1 to 2. The as-deposited films were polycrystalline and a linear relationship was observed between the total growth rate and the delivery rate of the Group II organometallic sources, which indicate that mass transfer-limited growth was achieved. Under these conditions the relative molar concentrations of the Sr and Ca in the film were directly proportional to their molar ratio in the inlet stream; fluorine was identified by EDS analysis.

EXAMPLE XXIX

MOCVD of BiSrCaCuO Film

A delivery system of the type schematically shown in FIG. 2 of prior copending U.S. application Ser. No. 07/549,389 filed Jul. 6, 1990 was employed to deliver strontium and calcium source reagents to the deposition reactor in the MOCVD of BiSrCaCuO HTSC films.

The bismuth source reagent was bismuth ethoxide, $Bi(OC_2H_5)_3$, the calcium and strontium source reagents were calcium and strontium bis (2,2-dimethyl-6,6,7,7,8,8,8-heptafluoro-3,5,octanedionates), and the copper source reagent was copper bis(hexafluoroacetylacetonate). MOCVD of BiSrCaCuOF was carried out at 500° C. and 2 torr at an oxygen-to-argon ratio of 1. The reactor parameters are set out in Table XIII below.

TABLE XIII

| Run No. | Delivery Rate (mmol/min) | | Carrier Flow Rate (Cm³/min) | | Growth Rate (mg/min)§ | Stoichiometry |
|---|---|---|---|---|---|---|
| | Ca | Sr | Bi | Cu | | |
| 1* | 46.1 | 33.0 | 50 | 70.4 | 54.7 | — |
| 2 | 38.3 | 27.4 | 25 | 44 | 22.6 | — |
| 3 | 511 | 366 | 25 | 38 | 37.3 | 2-4.5-2.4-3-7 |
| 4 | 210 | 238 | 25 | 32 | 31.5 | 2-1.5-1.0-2.8 |
| 5 | 287 | 325 | 25 | 32 | 33.3 | 2-2.4-1.9-3.8 |
| 6 | 257 | 291 | 25 | 24 | ** | 2-2.4-2.1-3.0 |
| 7 | 296 | 336 | 25 | 24 | 33.2 | 2-2.4-2.5-3.8 |
| 8 | 295 | 335 | 30 | 30 | 33.6 | 2-5.9-2.9-5.6 |
| 9 | 286 | 325 | 25 | 24 | ** | 2-2.1-1.9-2.2 |
| 10 | 290 | 329 | 25 | 24 | ** | — |
| 11 | 299 | 339 | 25 | 24 | ** | 2-11-6.8-6.7 |
| 12 | 295 | 335 | 30 | 30 | ** | 2-4.4-3.6-3.5 |

Bismuth bubbler held at 180° C., copper bubbler held at 60° C., substrate is Si(100).
§Normalized to the area of 2 inch diameter silicon wafer (20.3 cm²).
*Reactor pressure was 4 torr, Bi bubbler at 180° C.
**Pt and Pt/W fiber substrates.

The growth rate under these conditions was 0.5 to 1 microns/hour.

The BiSrCaCuO/MgO(100) films were annealed by the following sequence of steps:

1.) heating to 870° C. at 30° C./minute in flowing oxygen saturated with water at 20° C.;
2.) holding the temperature at 870° C. for 2 hours in wet oxygen; switching the flow of water off and maintaining the oxygen flow for an addition 3 hours; and
3.) cooling to room temperature in flowing oxygen at 30° C./minute.

The post-annealed films were nearly smooth with an average grain size of 6 to 10 microns. The resistive transitions had onsets of 110° K. and were fully superconducting by 80° K. Energy dispersive X-ray analysis indicated that all the fluorine had been removed by this treatment. The high transition temperature and planar morphology were indicative of c-axis oriented growth.

While the invention has been described with reference to specific aspects, features, and embodiments thereof, it will be apparent that various modifications, variations, and embodiments are possible, and accordingly the invention is to be broadly construed with respect to all such modifications, variations, and embodiments as being within the spirit and scope of the invention.

What is claimed is:

1. A Group II metalorganic complex of the formula:

$$MA_2X$$

wherein
M is barium, calcium, or strontium;
A is a monodentate or multidentate organic ligand coordinated to M which allows complexing of $MA_2$ with ligand X and which forms a stable STP sub-complex $MA_2$ with M;
each of the A ligands may be the same or different; and
X is a monodentate or multidentate ligand coordinated to M and containing one or more atoms independently selected from the group consisting of atoms of the elements C, N, H, S, O and F, X being selected such that the metalorganic complex $MA_2X$:
(a) is of higher volatility than the sub-complex $MA_2$;
(b) has a vapor pressure of at least 100 microns of mercury at a temperature in the range of from 120° C. to 250° C.;
(c) is thermally stable below about 250° C.; and
(d) thermally decomposes at a temperature of $\geq 400°$ C.

2. A complex according to claim 1, wherein A is selected from the group consisting of β-diketonates, cyclopentadienyls, alkyls, perfluoroalkyls, alkoxides, perfluoroalkoxides, and Schiff bases.

3. A complex according to claim 1, wherein A is selected from the group consisting of β-diketonates and cyclopentadienyls.

4. A complex according to claim 1, wherein A is a β-diketonate.

5. A complex according to claim 1, wherein A is selected from the group consisting of:
(i) 2,2,6,6-tetramethyl-3,5-heptanedionate;
(ii) 1,1,1,5,5,5-hexafluoro-2,4-pentanedionate;
(iii) 1,1,1,2,2,3,3-heptafluoro-7,7-dimethyl-4,6-octanedionate;
(iv) 4,4'-(ethane-1, 2-diyldiimino) bis (pent-3-ene-2-one);
(v) cyclopentadienyl;
(vi) pentamethylcyclopentadienyl;
(vii) 2,4-pentadionate; and
(viii) 1,1,1-trifluoro-2,4-pentadionate.

6. A complex according to claim 1, wherein X is selected from the group consisting of:
(i) oxyhydrocarbyl ligands;
(ii) nitrogenous oxyhydrocarbyl ligands; and
(iii) fluorooxyhydrocarbyl ligands.

7. A complex according to claim 1, wherein X is selected from the group consisting of:
(a) amines and polyamines;
(b) bipyridines;
(c) ligands of the formula:

wherein G is —O—, —S—, or —NR—, wherein R is H or hydrocarbyl;
(d) crown ethers; and
(e) ligands of the formula:

$$R^0O(C(R^1)_2C(R^2)_2O)_nR^0$$

wherein:
$R^0$ = H, methyl, ethyl, n-propyl, cyanato, perfluoroethyl, perfluoro-n-propyl, or vinyl;
$R^1$ = H, F, or a sterically acceptable hydrocarbyl substituent;
$R^2$ = H, F, or a sterically acceptable hydrocarbyl substituent;
n = 4, 5, or 6; and
each $R^0$, $R^1$, and $R^2$ may be the same as or different from the other $R^0$, $R^1$, and $R^2$, respectively.

8. A complex according to claim 1, wherein X is selected from the group consisting of tetraglyme, tetrahydrofuran, bipydridine, and 18 crown 6 ethers.

9. A complex according to claim 1, wherein X comprises a ligand of the formula:

$$R^0O(C(R^1)_2C(R^2)_2O)_nR^0$$

wherein:
$R^0$ = H, methyl, ethyl, n-propyl, cyanato, perfluoroethyl, perfluoro-n-propyl, or vinyl;
$R^1$ = H, F, or a sterically acceptable hydrocarbyl substituent;
$R^2$ = H, F, or a sterically acceptable hydrocarbyl substituent;
n = 4, 5, or 6; and
each $R^0$, $R^1$, and $R^2$ may be the same as or different from the other $R^0$, $R^1$, and $R^2$, respectively.

10. A complex according to claim 1, wherein X comprises a ligand of the formula:

$$R^0O(C(R^1)_2C(R^2)_2O)_4R^0$$

wherein:
each $R^0$, $R^1$ and $R^2$ is selected independently, and
$R^0$ = H, $CH_3$, or $C_2H_5$;
$R^1$ and $R^2$ = H or F.

11. A complex according to claim 1, wherein: M is barium; A is a β-diketonate; and X is tetraglyme, 18 crown 6 ether, or bipyridine.

12. A complex according to claim 1, wherein both ligands A are constituent moieties of a single group which is coordinatingly attached to M thereby.

13. A complex according to claim 1, wherein the ligand X and at least one of said ligands A are constituent moieties of a single group which is coordinatingly attached to M thereby.

14. A method of making a Group II β-diketonate compound, comprising reacting a hydride of the Group II metal with a dione corresponding to the β-diketonate, in a non-aqueous solvent medium.

15. A method according to claim 14, wherein the non-aqueous solvent medium comprises a solvent selected from the group consisting of (i) compounds of the formula

wherein G is selected from the group consisting of —S—, —O—, and —NR— wherein R is H or hydrocarbyl, and (ii) straight chain ethers.

16. A method according to claim 15, wherein G is —O—.

17. A method according to claim 14, wherein the dione has the formula $$R_a-\overset{O}{\underset{\|}{C}}-R_b-\overset{O}{\underset{\|}{C}}-R_c$$

wherein $R_a$ is fluoroalkyl, $R_b$ is akylene, and $R_c$ is alkyl.

18. A method according to claim 17, wherein $R_a$ is perfluoropropyl, $R_b$ is methylene, and $R_c$ is t-butyl.

19. A Group II metalorganic complex of the formula:

$$MA_2X$$

wherein:
M is barium, calcium, or strontium;
A is a monodentate or multidentate organic ligand coordinated to M which allows complexing of $MA_2$ with ligand X and which forms a stable STP sub-complex $MA_2$ with M wherein A is selected from the group consisting of cyclopentadienyls, alkyls, perfluoroalkyls, alkoxides, perfluoroalkoxides, and Schiff bases;
each of the A ligands may be the same or different; and
X is a monodentate or multidentate ligand coordinated to M and containing one or more atoms independently selected from the group consisting of atoms of the elements C, N, H, S, O and F, X being selected such that the metalorganic complex $MA_2X$:
(a) is of higher volatility than the sub-complex $MA_2$;
(b) has a vapor pressure of at least 100 microns of mercury at a temperature in the range of from 120° C. to 250° C.;
(c) is thermally stable below about 250° C.; and
(d) thermally decomposes at a temperature of ≧400° C.

20. A complex according to claim 19, wherein A is selected from the group consisting of β-diketonates and cyclopentadienyls.

21. A complex according to claim 14, wherein A is selected from the group consisting of cyclopentadienyl and pentamethylcyclopentadienyl.

22. A complex according to claim 14, wherein X is selected from the group consisting of:
(i) oxyhydrocarbyl ligands;
(ii) nitrogenous oxyhydrocarbyl ligands; and
(iii) fluorooxyhydrocarbyl ligands.

23. A complex according to claim 14, wherein X is selected form the group consisting of:
(a) amines and polyamines;
(b) bipyridines;
(c) ligands of the formula:

wherein G is —O—, —S—, or —NR—, wherein R is H or hydrocarbyl;
(d) crown ethers; and
(e) ligands of the formula:

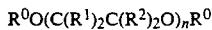

wherein:
$R^0$ = H, methyl, ethyl, n-propyl, cyanato, perfluoroethyl, perfluoro-n-propyl, or vinyl;
$R^1$ = H, F, or a sterically acceptable hydrocarbyl substituent;
$R^2$ = H, F, or a sterically acceptable hydrocarbyl substituent;
n = 4, 5, or 6; and
each $R^0$, $R^1$, and $R^2$ may be the same as or different from the other $R^0$, $R^1$, and $R^2$, respectively.

24. A complex according to claim 19, wherein X is selected from the group consisting of tetraglyme, tetrahydrofuran, bipydridine, and 18 crown 6 ethers.

25. A complex according to claim 19, wherein X comprises a ligand of the formula:

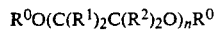

wherein:
$R^0$ = H, methyl, ethyl, n-propyl, cyanato, perfluoroethyl, perfluoro-n-propyl, or vinyl;
$R^1$ = H, F, or a sterically acceptable hydrocarbyl substituent;
$R^2$ = H, F, or a sterically acceptable hydrocarbyl substituent;
n = 4, 5, or 6; and
each $R^0$, $R^1$, and $R^2$ may be the same as or different from the other $R^0$, $R^1$, and $R^2$, respectively.

26. A complex according to claim 19, wherein X comprises a ligand of the formula:

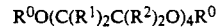

wherein:
each $R^0$, $R^1$ and $R^2$ is selected independently, and $R^0$ = H, $CH_3$, or $C_2H_5$; and
$R^1$ and $R^2$ = H or F.

27. A complex according to claim 19, wherein: M is barium; A is selected form the group consisting of cyclopentadienyls, alkyls, perfluoroalkyls, alkoxides, perfluoroalkoxides, and Schiff bases; and X is tetraglyme, 18 crown 6 ether, or bipyridine.

28. A complex according to claim 19, wherein both ligands A are constituent moieties of a single group which is coordinatingly attached to M thereby.

29. A complex according to claim 19, wherein the ligand X and at least one of said ligands A are constituent moieties of a single group which is coordinatingly attached to M thereby.

30. A method of making a Group II β-diketonate compound, comprising reacting a hydride of a Group II metal selected form the group consisting of barium, calcium, and strontium with a dione corresponding to the β-diketonate, in a non-aqueous solvent medium.

31. A method according to claim 30, wherein the non-aqueous solvent medium comprises a solvent selected form the group consisting of (i) compounds of the formula

wherein G is selected from the group consisting of —S—, —O—, and —NR— wherein R is H or hydrocarbyl, and
(ii) straight chain ethers.

32. A method according to claim 31, wherein G is —O—.

33. A method according to claim 30, wherein the dione has the formula

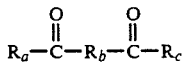

wherein $R_a$ is fluoroalkyl, $R_b$ is alkylene, and $R_c$ is alkyl.

34. A method according to claim 33, wherein $R_a$ is perfluoropropyl, $R_b$ is methylene, and $R_c$ is t-butyl.

35. A complex according to claim 1, wherein X is selected from the group consisting of tetraglyme, tetrahydrofuran, amines, polyamines, bipyridine, and bipyridine analogs of the formula ZWZ wherein Z is pyridinyl and W is a divalent organic linking group.

* * * * *

UNITED STATES PATENT AND TRADEMARK OFFICE
CERTIFICATE OF CORRECTION

PATENT NO. : 5,225,561
DATED : July 6, 1993
INVENTOR(S) : Peter S. Kirlin, et al.

It is certified that error appears in the above-indentified patent and that said Letters Patent is hereby corrected as shown below:

In claim 1, column 50, line 35, after "about" insert
-- 120- --.

In claim 19, column 52, line 49, after "about" insert
-- 120- --.

Signed and Sealed this

First Day of November, 1994

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,225,561
DATED : July 6, 1993
INVENTOR(S) : Peter S. Kirlin, Duncan W. Brown & Robin A. Gardiner It is certified that error appears in the above-indentified patent and that said Letters Patent is hereby corrected as shown below:

In claim 19, column 52, line 32, insert before "cyclopentadienyls," the species -- β-diketonates --.

Signed and Sealed this

Fourth Day of April, 1995

Attest:

BRUCE LEHMAN

Attesting Officer      Commissioner of Patents and Trademarks